(12) United States Patent
Hatano et al.

(10) Patent No.: US 8,981,515 B2
(45) Date of Patent: Mar. 17, 2015

(54) SOLID-STATE IMAGING DEVICE AND ELECTRONIC APPARATUS

(75) Inventors: Keisuke Hatano, Kanagawa (JP); Atsushi Toda, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 13/534,309

(22) Filed: Jun. 27, 2012

(65) Prior Publication Data
US 2013/0009263 A1  Jan. 10, 2013

(30) Foreign Application Priority Data
Jul. 6, 2011  (JP) ................. 2011-149972

(51) Int. Cl.
*H01L 31/00*  (2006.01)
*H01L 27/146*  (2006.01)

(52) U.S. Cl.
CPC ...... *H01L 27/14647* (2013.01); *H01L 27/1464* (2013.01); *H01L 27/14621* (2013.01)
USPC ......................................... 257/440; 257/443

(58) Field of Classification Search
CPC ....... H01L 31/00; H01L 21/00; H01L 31/062; H01L 51/30; H01L 27/14647; H01L 27/1464; H01L 27/14621
USPC ........ 257/431, 440–443, 432, 435, 436, 461, 257/E27.13, E27.133, E27.134, E27.135, 257/E27.141, E27.149
See application file for complete search history.

(56) References Cited

U.S. PATENT DOCUMENTS

| | | | |
|---|---|---|---|
| 2001/0013898 A1* | 8/2001 | Bawolek et al. | 348/272 |
| 2004/0217395 A1* | 11/2004 | Takamura | 257/291 |
| 2005/0087829 A1* | 4/2005 | Merrill et al. | 257/440 |
| 2008/0251876 A1* | 10/2008 | Tishin et al. | 257/440 |
| 2009/0085029 A1* | 4/2009 | Mitsui et al. | 257/40 |

FOREIGN PATENT DOCUMENTS

JP  2003-303949  10/2003

* cited by examiner

*Primary Examiner* — David Vu
*Assistant Examiner* — Mouloucoulaye Inoussa
(74) *Attorney, Agent, or Firm* — Sheridan Ross P.C.

(57) ABSTRACT

A solid-state imaging device includes a plurality of photoelectric conversion regions stacked at different depths within a semiconductor substrate of each pixel to photoelectrically convert light of different wavelength bands, and a discharge region formed between the photoelectric conversion regions adjacent to each other in a depth direction of the semiconductor substrate to discharge charges generated by photoelectric conversion in regions between the photoelectric conversion regions.

20 Claims, 12 Drawing Sheets

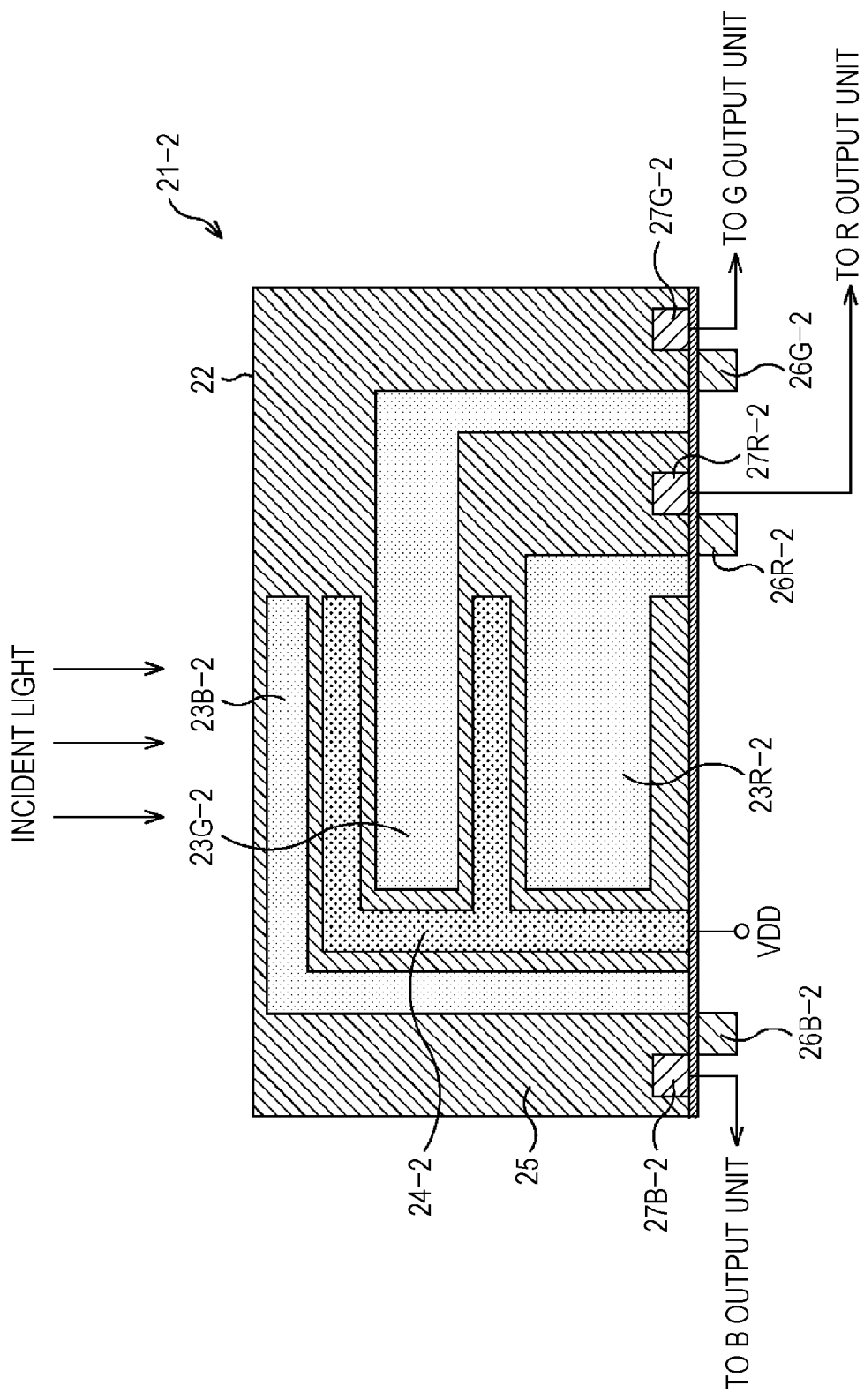

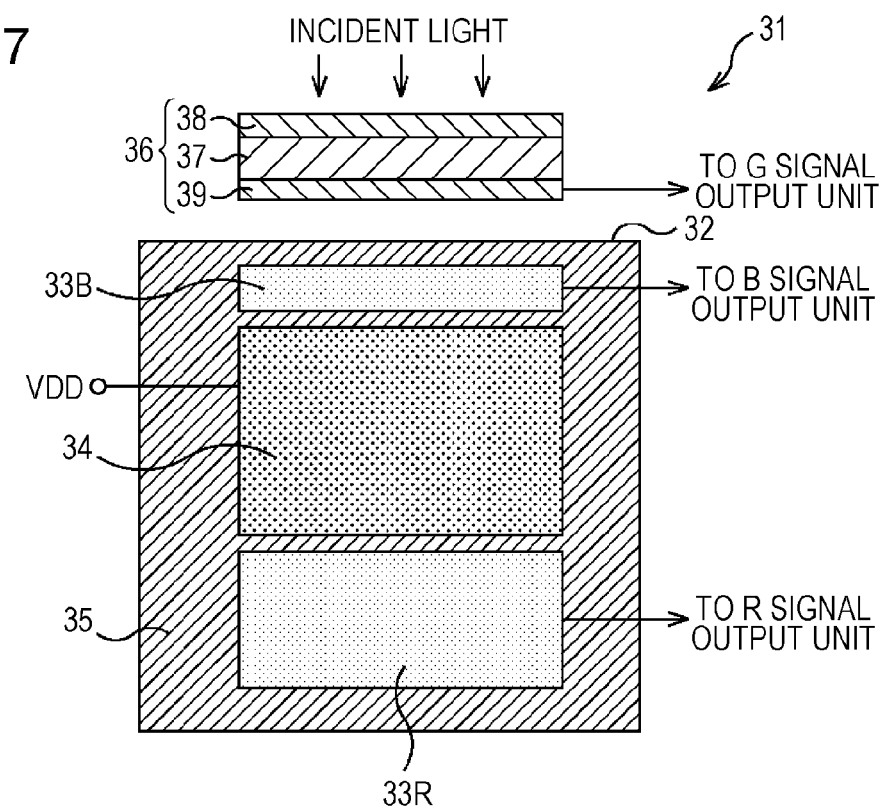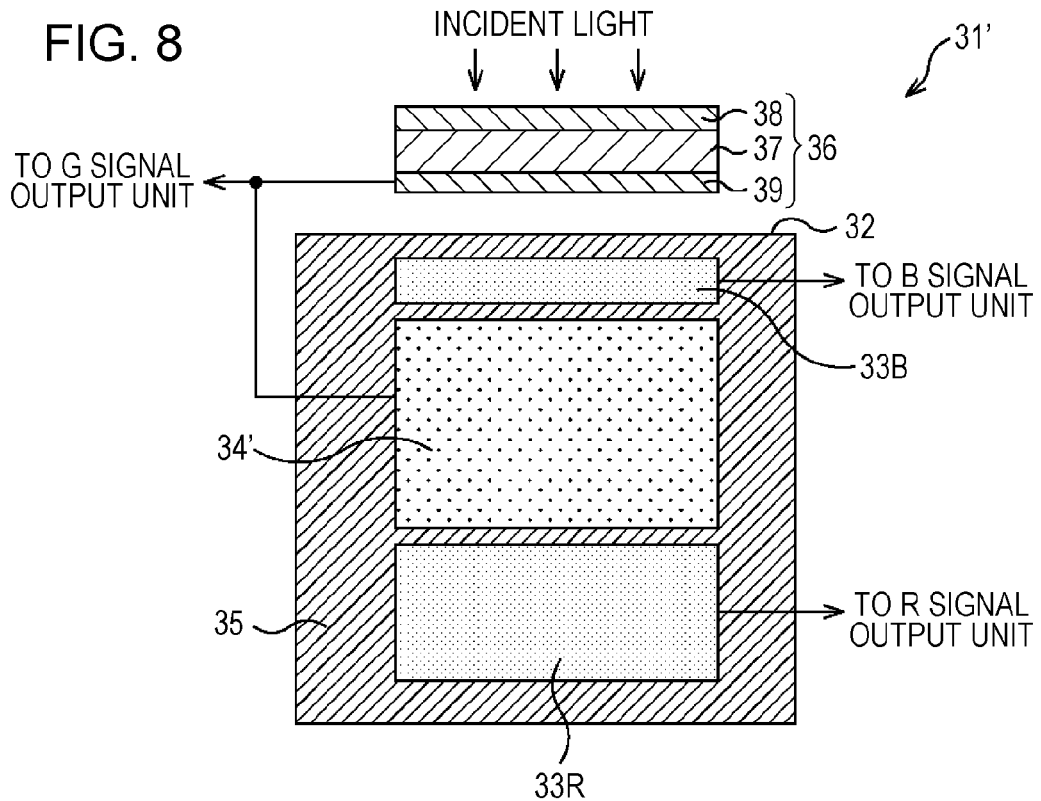

SOLID-STATE IMAGING DEVICE AND ELECTRONIC APPARATUS

BACKGROUND

The present technology relates to a solid-state imaging device and an electronic apparatus, and in particular relates to a solid-state imaging device with improved color reproducibility and an electronic apparatus including such a solid-state imaging device.

In the related art, solid-state imaging devices employed in digital still cameras and other electronic apparatus have color filters formed on photoelectric conversion regions to allow light of only a specific wavelength band to enter each pixel in the photoelectric conversion region. This allows the solid-state imaging device to obtain color information corresponding to the color of the color filter in each pixel in the photoelectric conversion region.

The color filters of different colors are arranged, for example, in a so-called Bayer array in which the primary color filters of three primary colors including red, blue, and green are arranged in a checkered pattern. In this arrangement, in some pixels, color information of colors other than the color arranged on these pixels is obtained by complementing the color from other pixels in their peripheries. Color information obtained by arithmetical operation complementing the color by other colors may differ from the original color information and may not correctly reproduce the actual color.

Japanese Unexamined Patent Application Publication No. 2003-303949, for example, proposes a solid-state imaging device having a structure outputting image signals, which are converted from incident light of different wavelength bands, from a single pixel without complementing colors from other pixels in its periphery.

Referring now to FIG. 1, an exemplary configuration of the solid-state imaging device capable of obtaining image signals of three colors from a single pixel will be described.

FIG. 1 shows a sectional view of a solid-state imaging device 11 including photoelectric conversion regions 13B, 13G, and 13R stacked within a silicon substrate 12 of each pixel. In the solid-state imaging device 11, a P-type well 14 is formed between these regions.

The photoelectric conversion region 13B photoelectrically converts and outputs signals corresponding to the intensity of light of blue wavelength band through a B signal output unit, the photoelectric conversion region 13G photoelectrically converts and outputs signals corresponding to the intensity of light of green wavelength band through a G signal output unit, and the photoelectric conversion region 13R photoelectrically converts and outputs signals corresponding to the intensity of light of red wavelength band through an R signal output unit.

FIG. 2 shows spectral sensitivity characteristics of the solid-state imaging device 11, i.e., relative sensitivities to the wavelengths of the blue output from the photoelectric conversion region 13B, green output from the photoelectric conversion region 13G, and red output from the photoelectric conversion region 13R.

The spectral characteristics in FIG. 2 show that the spectrum distributions of the blue, green, and red outputs are broad, indicating that the solid-state imaging device 11 has low performance of spectrum resolution.

More specifically, as shown in the spectral characteristics in FIG. 2, the spectrum distributions of the outputs (blue, green, and red outputs) from the stacked photoelectric conversion regions 13B, 13G, 13R significantly overlap each other. For example, looking at the relative sensitivities at a wavelength of 550 nm at which green should be output, the output from the photoelectric conversion region 13G formed in the intermediate layer of the three layers stacked in the depth direction of the substrate and the output from the photoelectric conversion region 13R formed in the deepest layer are substantially the same.

When incident light has a wavelength of 550 nm, which is originally green light, only green should be output. Red would be output, however, at the same intensity as green, which would make it difficult to reproduce the original color because an intermediate color between green and red, i.e., orange, would be reproduced if the color information that should be of green is reproduced on the screen without being separated from red. Due to these spectral characteristics, complicate signal processing would be necessary to reproduce the original color; change in color temperature of the incident light would make it difficult to reproduce the color correctly.

SUMMARY

As described above, in the related art, since solid-state imaging devices capable of obtaining image signals of three colors from a single pixel have low spectrum resolution, it has been difficult to reproduce correct colors when the color temperature of incident light changes, for example.

It is desirable to provide a solid-state imaging device with improved color reproducibility.

A solid-state imaging device according to an embodiment of the present technology includes a plurality of photoelectric conversion regions stacked at different depths within a single semiconductor substrate of each pixel to photoelectrically convert light of different wavelength bands and a discharge region formed between the photoelectric conversion regions adjacent to each other in the depth direction of the semiconductor substrate to discharge the charges generated by photoelectric conversion in the regions between the adjacent photoelectric conversion regions.

An electronic apparatus according to an embodiment of the present technology includes a solid-state imaging device having a plurality of photoelectric conversion regions stacked at different depths within a single semiconductor substrate of each pixel to photoelectrically convert light of different wavelength bands and a discharge region formed between the photoelectric conversion regions adjacent to each other in the depth direction of the semiconductor substrate to discharge the charges generated by photoelectric conversion in the regions between the adjacent photoelectric conversion regions.

According to an embodiment of the present technology, a plurality of photoelectric conversion regions are stacked at different depths within a single semiconductor substrate of each pixel to photoelectrically convert light of different wavelength bands and a discharge region formed between the photoelectric conversion regions adjacent to each other in the depth direction of the semiconductor substrate discharges the charges generated by photoelectric conversion in the regions between the adjacent photoelectric conversion regions.

According to an embodiment of the present technology, color reproducibility can be improved.

BRIEF DESCRIPTION OF THE DRAWINGS

FIG. 6 is a sectional view showing an exemplary configuration of the second variation of the embodiment of the solid-state imaging device;

FIG. 7 is a sectional view of an exemplary configuration of the solid-state imaging device to which another embodiment of the present technology is applied;

FIG. 8 is a sectional view showing an exemplary configuration of a variation of the solid-state imaging device to which the other embodiment of the present technology is applied;

DETAILED DESCRIPTION OF EMBODIMENTS

Specific embodiments of the present technology will now be described in detail with reference to the drawings.

Figure 1:
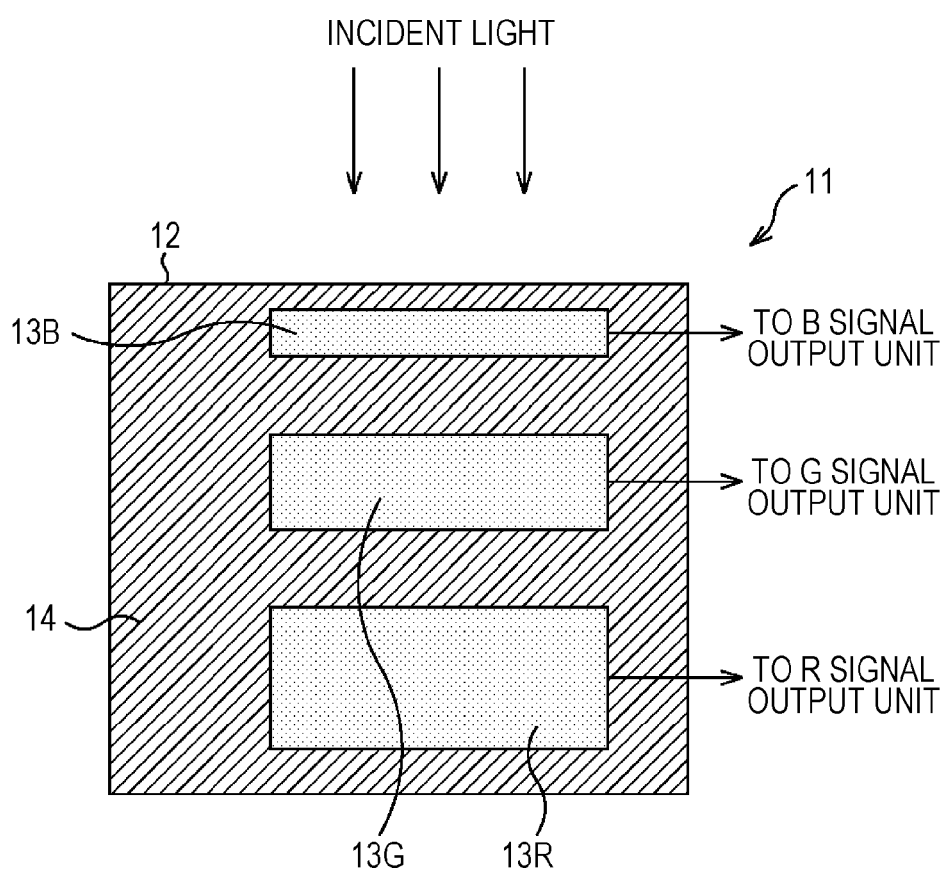
FIG. 1 is a sectional view showing an exemplary configuration of a solid-state imaging device in the related art capable of obtaining image signals of three colors from a single pixel.
Figure 2:
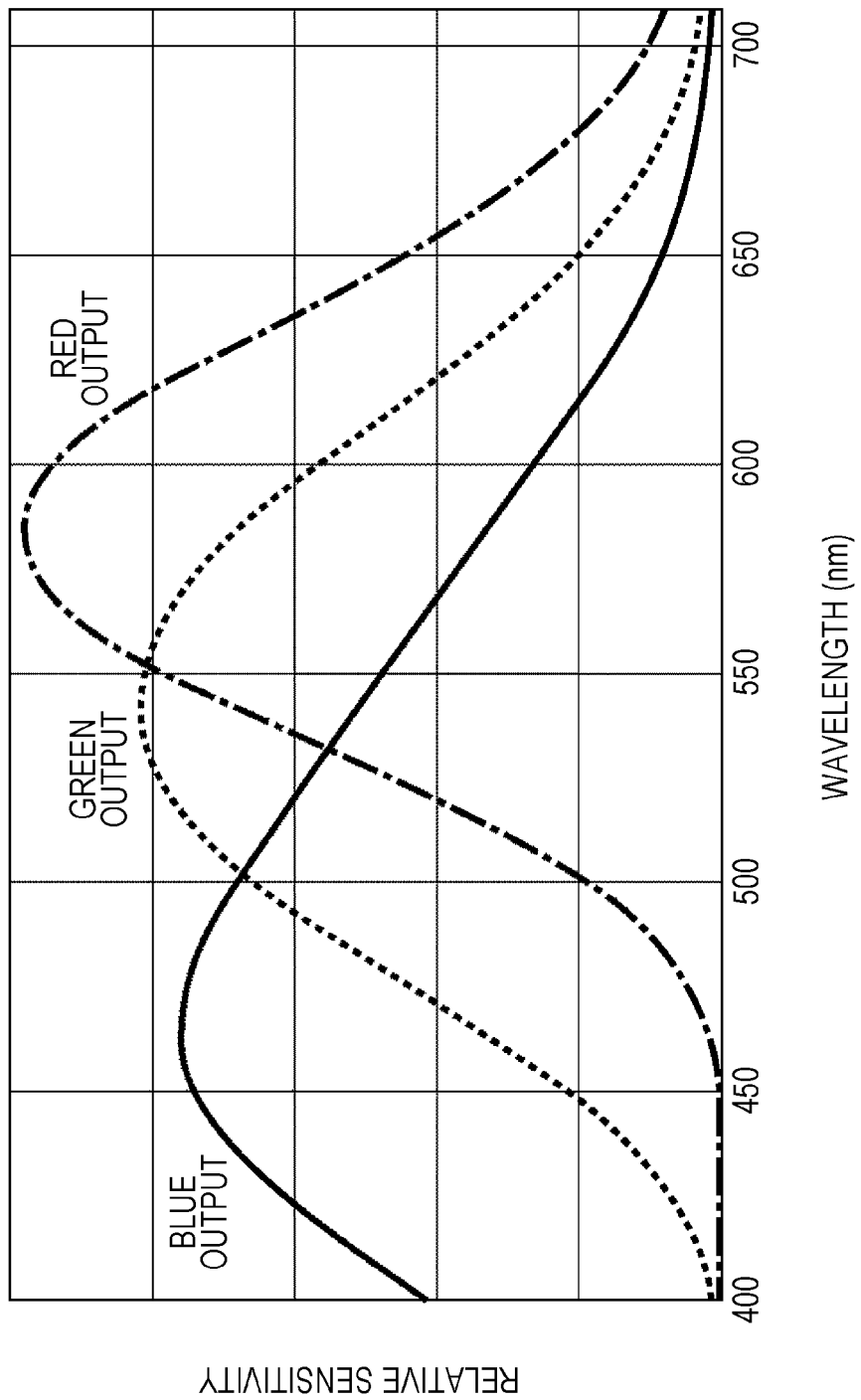
FIG. 2 shows relative sensitivities of the solid-state imaging device in the related art.
Figure 3:
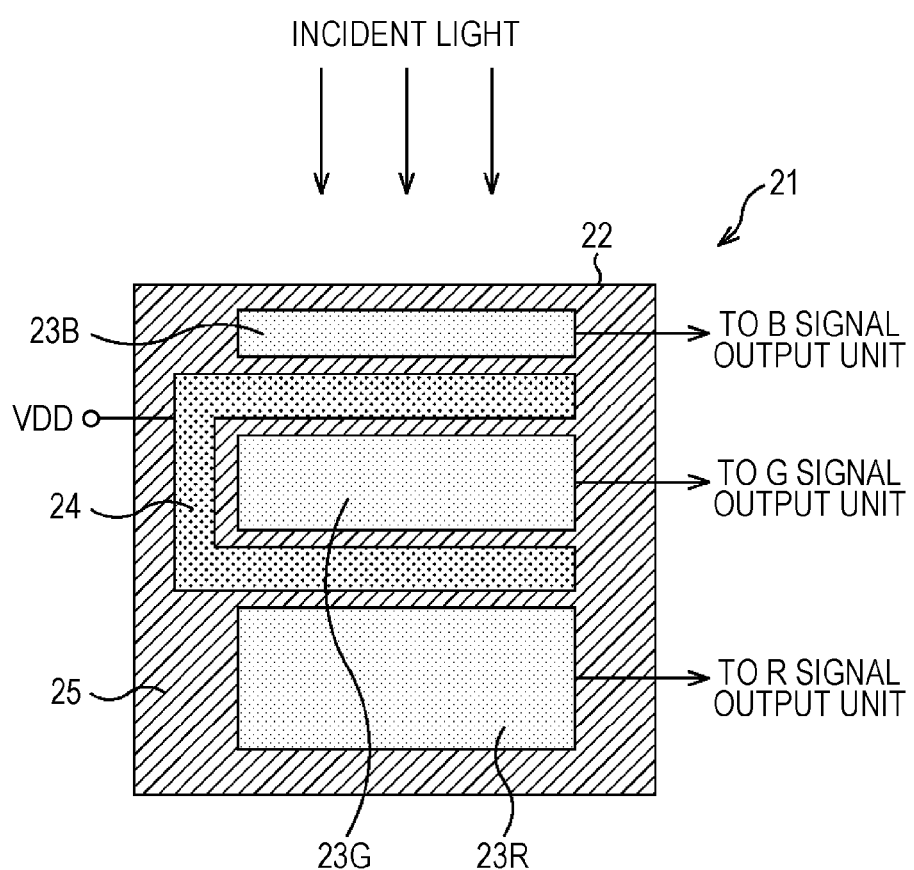
FIG. 3 is a sectional view showing an exemplary configuration of the solid-state imaging device to which an embodiment of the present technology is applied.

FIG. 3 is a sectional view showing an exemplary configuration of the solid-state imaging device to which an embodiment of the present technology is applied, showing the structure of a single pixel in the solid-state imaging device.

As shown in FIG. 3, the solid-state imaging device 21 includes a photoelectric conversion region 23B, the upper portion of a discharge region 24, a photoelectric conversion region 23G, the lower portion of the discharge region 24, and a photoelectric conversion region 23R stacked in this order within a silicon substrate 22 of each pixel, the photoelectric conversion region 23B being the closest to the light incident surface (the surface of the solid-state imaging device 21 on which light is incident). The solid-state imaging device 21 also has a P-type well 25 formed between these regions to isolate these regions.

The photoelectric conversion region 23B is an n-type impurity region formed within the silicon substrate 22 at the depth having the maximum sensitivity to the light of blue wavelength band around 450 nm and photoelectrically converts the light of blue wavelength band out of the light incident on the solid-state imaging device 21. The photoelectric conversion region 23B also has a B signal output unit (not shown) connected thereto to output a signal corresponding to the charges (electrons) generated by photoelectric conversion, i.e., a signal corresponding to the intensity of the light of blue wavelength band (referred to hereinafter as B signal as appropriate).

The photoelectric conversion region 23G is an n-type impurity region formed within the silicon substrate 22 at the depth having the maximum sensitivity to the light of green wavelength band around 550 nm and photoelectrically converts the light of green wavelength band out of the light incident on the solid-state imaging device 21. The photoelectric conversion region 23G also has a G signal output unit (not shown) connected thereto to output a signal corresponding to the charges generated by photoelectric conversion, i.e., a signal corresponding to the intensity of the light of green wavelength band (referred to hereinafter as G signal as appropriate).

The photoelectric conversion region 23R is an n-type impurity region formed within the silicon substrate 22 at the depth having the maximum sensitivity to the light of red wavelength band around 650 nm and photoelectrically converts the light of red wavelength band out of the light incident on the solid-state imaging device 21. The photoelectric conversion region 23R also has an R signal output unit (not shown) connected thereto to output a signal corresponding to the charges generated by photoelectric conversion, i.e., a signal corresponding to the intensity of the light of red wavelength band (referred to hereinafter as R signal as appropriate).

The discharge region 24 is a region formed from n-type impurities at higher concentration (N+ region) than the photoelectric conversion regions 23B, 23G, and 23R and is connected to a power supply terminal VDD of a predetermined voltage. The discharge region 24 is formed in a substantially C-shaped cross section including a portion extending between the photoelectric conversion regions 23B and 23G, a portion extending between the photoelectric conversion regions 23G and 23R, and a portion connecting these two portions to each other. Each portion of the discharge region 24 is interposed between the portions of the P-type well 25.

The portion of the discharge region 24 extending between the photoelectric conversion regions 23B and 23G takes in the charges generated by photoelectric conversion in the region between the photoelectric conversion regions 23B and 23G and discharges these charges through the power supply terminal VDD. The portion of the discharge region 24 extending between the photoelectric conversion regions 23G and 23R takes in the charges generated by photoelectric conversion in the region between the photoelectric conversion regions 23G and 23R and discharges these charges through the power supply terminal VDD.

The solid-state imaging device 21 thus configured can take in the discharge region 24 and discharge the charges generated by photoelectric conversion in the region between the photoelectric conversion regions 23B and 23G. Accordingly, the solid-state imaging device 21 can prevent the charges generated by photoelectric conversion in the region between the photoelectric conversion regions 23B and 23G from being taken into the photoelectric conversion region 23B or 23G and output as a B or G signal.

The solid-state imaging device 21 can therefore prevent crosstalk from being generated between the B and G signals. In the solid-state imaging device 21, since the charges generated by photoelectric conversion in the region between the photoelectric conversion regions 23B and 23G are not taken into the photoelectric conversion region 23B or 23G, crosstalk will not be generated between the B and G signals.

Similarly, since the charges generated by photoelectric conversion in the region between the photoelectric conversion regions 23G and 23R can be taken into and discharged through the discharge region 24, the solid-state imaging device 21 can prevent crosstalk from being generated between the G and R signals.

Figure 4:
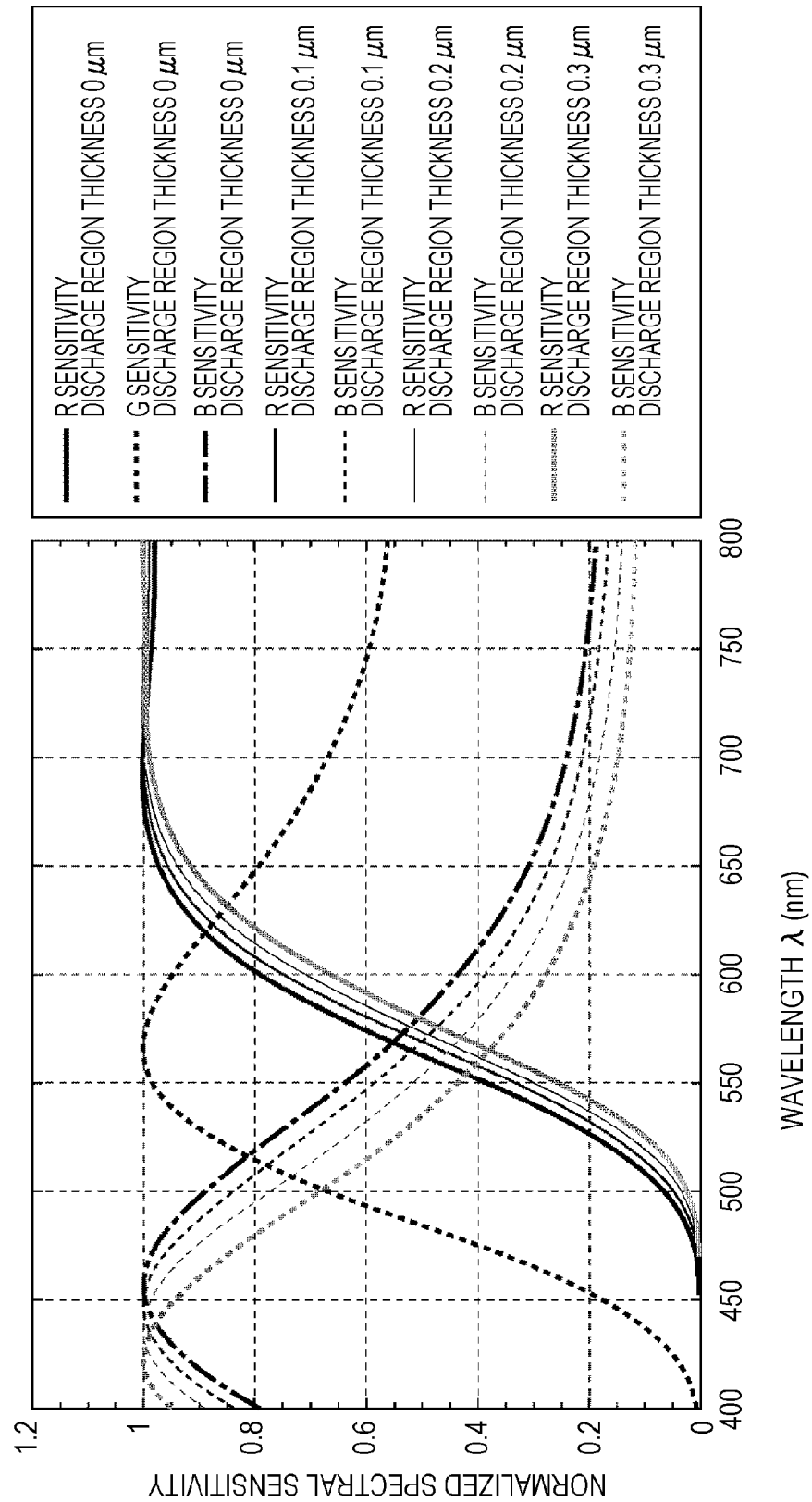
FIG. 4 shows simulation results of the color separation characteristics of the solid-state imaging device.

FIG. 4 shows simulation results of the color separation characteristics of the solid-state imaging device 21 shown in FIG. 3.

FIG. 4 shows spectral shape variations of each color that are obtained when the discharge region 24 is provided between the photoelectric conversion regions 23B and 23G such that the photoelectric conversion region 23B is reduced while the photoelectric conversion region 23G remains unchanged and when the discharge region 24 is provided between the photoelectric conversion regions 23G and 23R such that the photoelectric conversion region 23R is reduced while the photoelectric conversion region 23G remains unchanged.

As can be seen from FIG. 4, when the discharge region 24 is provided and then enlarged in thickness, the spectral curves of blue and red shift downward in the graph and overlap less the spectral curve of green. This indicates that the color separability is improved and thus the color reproducibility is enhanced.

More specifically, at the wavelength of 520 nm, when the discharge region 24 is not formed (0 μm), the blue signal output is 0.8 with respect to the green signal output of 1 at the highest sensitivity. When the discharge region 24 is formed, the blue signal output is reduced; when the discharge region 24 is enlarged in thickness (from 0.1 μm to 0.3 μm), the blue signal output is further reduced. When the discharge region 24 is 0.3 μm thick, the blue signal output is 0.6 at the wavelength of 520 nm and thus the spectral curve of blue overlaps less the spectral curve of green.

Thus, the solid-state imaging device 21 can further separate the colors from each other and enhance the color reproducibility than in the related art. Accordingly, the solid-state imaging device 21 has better color separation performance and can improve the color reproducibility of captured images.

As described above, the discharge region 24 has the portions mutually connected in a substantially C-shaped cross section within the silicon substrate 22, including the portion extending between the photoelectric conversion regions 23B and 23G and the portion extending between the photoelectric conversion regions 23G and 23R. Alternatively, the discharge region 24 may be formed from discrete (not connected) portions including, for example, a portion extending between the photoelectric conversion regions 23B and 23G and a portion extending between the photoelectric conversion regions 23G and 23R. In this case, the discrete portions forming the discharge region 24 can be connected outside the silicon substrate 22 to different power supply terminals or to a common power supply terminal.

The charges photoelectrically converted and accumulated in the photoelectric conversion regions 23B, 23G, and 23R can be output to the outside through charge readout units. These readout units may be disposed on the light incident surface of the silicon substrate 22 or on the surface opposite thereto.

Figure 5:
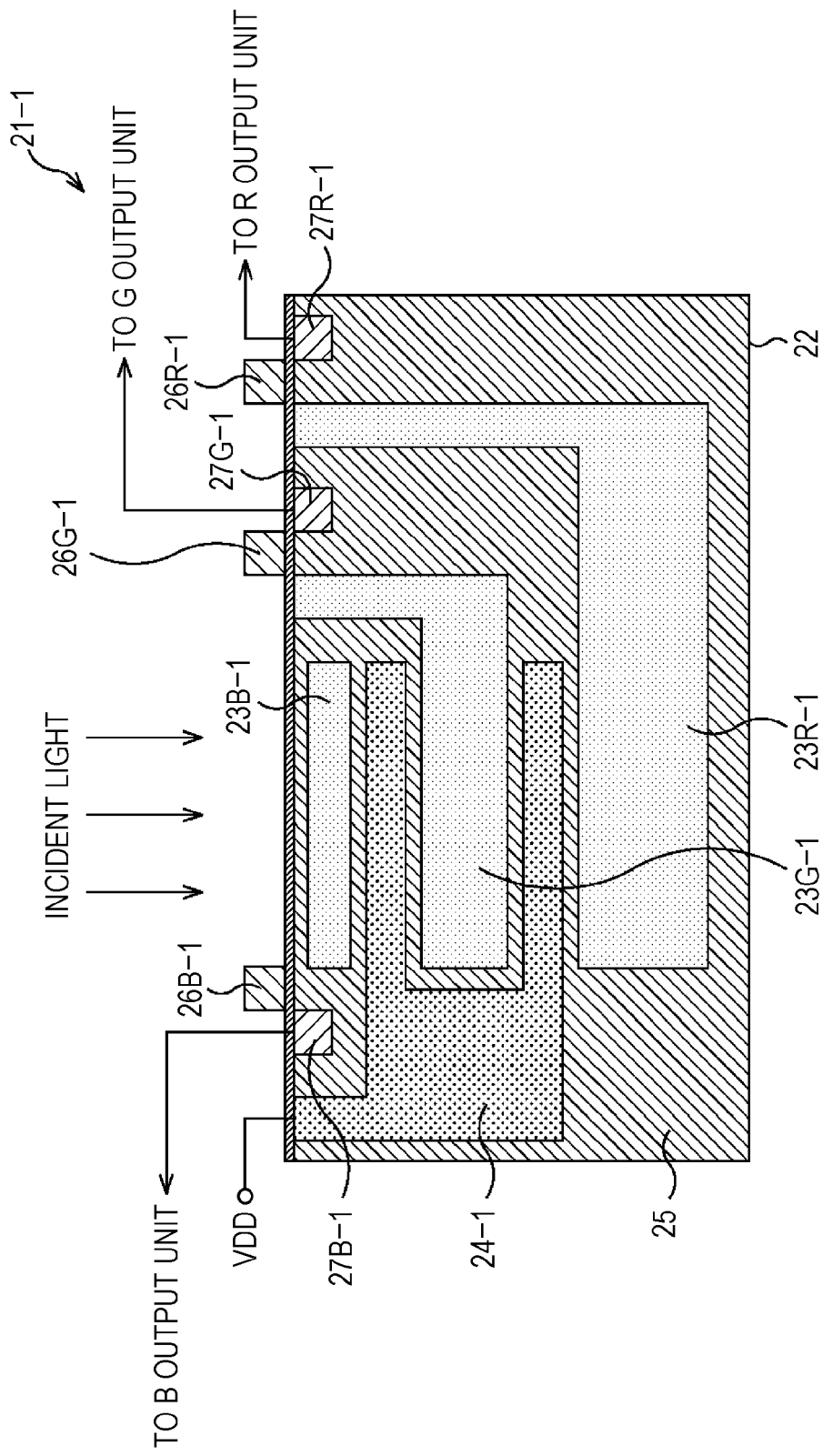
FIG. 5 is a sectional view showing an exemplary configuration of the first variation of the embodiment of the solid-state imaging device.

For example, a so-called front-illuminated type solid-state imaging device having readout units on the light incident surface of the silicon substrate 22 is shown in FIG. 5, while a so-called back-illuminated type solid-state imaging device having readout units on the surface of the silicon substrate 22 opposite to the light incident surface is shown in FIG. 6.

FIG. 5 is a sectional view showing an exemplary configuration of the first variation of the solid-state imaging device to which the above embodiment of the present technology is applied.

As shown in FIG. 5, the solid-state imaging device 21-1 has photoelectric conversion regions 23G-1 and 23R-1 extending to the light incident surface of the silicon substrate 22. A discharge region 24-1 also extends to the light incident surface of the silicon substrate 22.

A signal charge readout electrode 26B-1 for controlling the readout of the signal charges from the photoelectric conversion region 23B-1 is formed on the light incident surface of the silicon substrate 22 in the vicinity of the photoelectric conversion region 23B-1. A diffusion layer region 27B-1 for transferring the signal charges from the photoelectric conversion region 23B-1 is formed inside the light incident surface of the silicon substrate 22 in the vicinity of the photoelectric conversion region 23B-1 with the signal charge readout electrode 26B-1 in between.

A signal charge readout electrode 26G-1 for controlling the readout of the signal charges from the photoelectric conversion region 23G-1 is formed on the light incident surface of the silicon substrate 22 in the vicinity of the portion of the photoelectric conversion region 23G-1 extending to the light incident surface. A diffusion layer region 27G-1 for transferring the signal charges from the photoelectric conversion region 23G-1 is formed inside the light incident surface of the silicon substrate 22 in the vicinity of the photoelectric conversion region 23G-1 with the signal charge readout electrode 26G-1 in between.

A signal charge readout electrode 26R-1 for controlling the readout of the signal charges from the photoelectric conversion region 23R-1 is formed on the light incident surface of the silicon substrate 22 in the vicinity of the portion of the photoelectric conversion region 23R-1 extending to the light incident surface. A diffusion layer region 27R-1 for transferring the signal charges from the photoelectric conversion region 23R-1 is formed inside the light incident surface of the silicon substrate 22 in the vicinity of the photoelectric conversion region 23R-1 with the signal charge readout electrode 26R-1 in between.

In the solid-state imaging device 21-1 thus configured, when a predetermined readout voltage is applied to the signal charge readout electrode 26B-1, the signal charges in the photoelectric conversion region 23B-1 are transferred to the diffusion layer region 27B-1. Similarly, when a predetermined readout voltage is applied to the signal charge readout electrode 26G-1, the signal charges in the photoelectric conversion region 23G-1 are transferred to the diffusion layer region 27G-1. In addition, when a predetermined readout voltage is applied to the signal charge readout electrode 26R-1, the signal charges in the photoelectric conversion region 23R-1 are transferred to the diffusion layer region 27R-1.

Resetting units (not shown) for resetting the diffusion layer regions 27B-1, 27G-1, and 27R-1 to a predetermined potential are disposed adjacent to the respective regions. The diffusion layer regions 27B-1, 27G-1, 27R-1 are connected to gate electrodes (not shown) of respective amplifier transistors to obtain output signals in response to this potential.

In FIG. 5, the solid-state imaging device 21-1 has diffusion layer regions 27B-1, 27G-1, 27R-1 associated with the photoelectric conversion regions 23B-1, 23G-1, and 23R-1, respectively. Alternatively, the solid-state imaging device 21-1 may be configured such that the photoelectric conversion regions 23B-1, 23G-1, and 23R-1 share a single diffusion layer region to output respective signals.

FIG. 6 is a sectional view showing an exemplary configuration of the second variation of the solid-state imaging device to which the above embodiment of the present technology is applied.

As shown in FIG. 6, the solid-state imaging device 21-2 has photoelectric conversion regions 23B-2, 23G-2, and 23R-2 extending to the surface of the silicon substrate 22 opposite to the light incident surface (opposite surface of the silicon substrate 22). A discharge region 24-2 also extends to the opposite surface of the silicon substrate 22.

A signal charge readout electrode 26B-2 for controlling the readout of the signal charges from the photoelectric conversion region 23B-2 is formed on the opposite surface of the silicon substrate 22 in the vicinity of the portion of the photoelectric conversion region 23B-2 extending to the opposite surface of the silicon substrate 22. A diffusion layer region 27B-2 for transferring the signal charges from the photoelectric conversion region 23B-2 is formed inside the opposite surface of the silicon substrate 22 in the vicinity of the photoelectric conversion region 23B-2 with the signal charge readout electrode 26B-2 in between.

A signal charge readout electrode 26G-2 for controlling the readout of the signal charges from the photoelectric conversion region 23G-2 is formed on the opposite surface of the silicon substrate 22 in the vicinity of the portion of the photoelectric conversion region 23G-2 extending to the opposite surface of the silicon substrate 22. A diffusion layer region 27G-2 for transferring the signal charges from the photoelectric conversion region 23G-2 is formed inside the opposite surface of the silicon substrate 22 in the vicinity of the photoelectric conversion region 23G-2 with the signal charge readout electrode 26G-2 in between.

A signal charge readout electrode 26R-2 for controlling the readout of the signal charges from the photoelectric conversion region 23R-2 is formed on the opposite surface of the silicon substrate 22 in the vicinity of the portion of the photoelectric conversion region 23R-2 extending to the opposite surface of the silicon substrate 22. A diffusion layer region 27R-2 for transferring the signal charges from the photoelectric conversion region 23R-2 is formed inside the opposite surface of the silicon substrate 22 in the vicinity of the photoelectric conversion region 23R-2 with the signal charge readout electrode 26R-2 in between.

In the solid-state imaging device 21-2 thus configured, similarly to the solid-state imaging device 21-1 in FIG. 5, charges from the photoelectric conversion regions 23B-2, 23G-2, and 23R-2 are read out in response to the predetermined readout voltage.

The resetting units and the gate electrodes of the amplifier transistors in the solid-state imaging device 21-2 are omitted from FIG. 6, similarly to the solid-state imaging device 21-1 in FIG. 5. Alternatively, the solid-state imaging device 21-2 may be configured such that the photoelectric conversion regions 23B-2, 23G-2, and 23R-2 share a single diffusion layer region.

Instead of the configuration shown in FIG. 5 or 6, the solid-state imaging device may be configured such that, for example, the charges from some photoelectric conversion regions are output through the light incident surface and the charges from the remaining photoelectric conversion regions are output through the opposite surface. In this configuration as well, the diffusion layer region may be shared to transfer the charges to be output through the same surface.

FIG. 7 is a sectional view of an exemplary configuration of the solid-state imaging device to which another embodiment of the present technology is applied, showing the structure of a single pixel in the solid-state imaging device.

As shown in FIG. 7, the solid-state imaging device 31 includes a photoelectric conversion region 33B, a discharge region 34, and a photoelectric conversion region 33R stacked within a silicon substrate 32 of each pixel in this order, the photoelectric conversion region 33B being the closest to the light incident surface. The solid-state imaging device 31 also has a P-type well 35 formed between these regions to isolate these regions. Above the light incident surface of the solid-state imaging device 31, a photoelectric conversion unit 36 is stacked with an insulating film (not shown) in between.

Similarly to the photoelectric conversion region 23B in FIG. 3, the photoelectric conversion region 33B photoelectrically converts light of blue wavelength band and outputs through the B signal output unit a B signal corresponding to the intensity of the light of blue wavelength band. Similarly to the photoelectric conversion region 23R in FIG. 3, the photoelectric conversion region 33R photoelectrically converts light of red wavelength band and outputs through the R signal output unit an R signal corresponding to the intensity of the light of red wavelength band.

The discharge region 34 is an N+ region formed in the region between the photoelectric conversion regions 33B and 33R and connected to a power supply terminal VDD of a predetermined voltage. Unlike the discharge region 24 in FIG. 3, the discharge region 34 includes the region in which the photoelectric conversion region 23G is formed in the solid-state imaging device 21 in FIG. 3. Accordingly, the discharge region 34 takes in the charges generated by photoelectric conversion in the region between the photoelectric conversion regions 33B and 33R and discharges these charges through the power supply terminal VDD.

The photoelectric conversion unit 36 includes between an upper electrode 38 and a lower electrode 39 a photoelectric conversion film 37 that has the maximum sensitivity to wavelengths around 550 nm and photoelectrically converts light of green wavelength band. A G signal output unit (not shown) is connected to the lower electrode 39 and a voltage is applied across the upper and lower electrodes 38 and 39 to output through the lower electrode 39 the charges photoelectrically converted in the photoelectric conversion film 37. Accordingly, the photoelectric conversion unit 36 outputs through the G signal output unit connected to the lower electrode 39 a signal corresponding to the charges generated by photoelectric conversion in the photoelectric conversion film 37, i.e., a G signal corresponding to the intensity of the light of green wavelength band.

In the solid-state imaging device 31 thus configured, the light of green wavelength band out of the light incident on the solid-state imaging device 31 is photoelectrically converted in the photoelectric conversion unit 36, while light of other wavelength bands corresponding to other colors passes through the photoelectric conversion unit 36 and enters the silicon substrate 32. In the solid-state imaging device 31, since the photoelectric conversion unit 36 absorbs and photoelectrically converts all the light of green wavelength band, the light of green wavelength band does not enter the silicon substrate 32. Accordingly, the solid-state imaging device 31 can prevent crosstalk from being generated in the photoelectric conversion regions 33B and 33R due to the light of green wavelength band. In addition, in the solid-state imaging device 31, crosstalk is not generated in the photoelectric conversion unit 36 due to the light of blue and red wavelength bands.

Of the light (other than the light of green wavelength band) incident on the silicon substrate 32, the light of blue wavelength band is photoelectrically converted in the photoelectric conversion region 33B, while the light of red wavelength band is photoelectrically converted in the photoelectric conversion region 33R.

In the solid-state imaging device 31, the charges generated by photoelectric conversion in the region between the photoelectric conversion regions 33B and 33R can be taken into and discharged through the discharge region 34. The solid-state imaging device 31 can therefore avoid the charges photoelectrically converted in the region between the photoelectric conversion regions 33B and 33R from being taken into the photoelectric conversion region 33B or 33R and output as a B or R signal. Accordingly, the solid-state imaging device 31 can prevent crosstalk from being generated between the B and R signals.

Since the solid-state imaging device 31 can thus prevent the generation of crosstalk between the different colors, it can achieve better color separation performance and improve the color reproducibility of captured images.

FIG. 8 is a sectional view showing an exemplary configuration of a variation of the solid-state imaging device to which the other embodiment of the present technology is applied.

Similarly to the solid-state imaging device 31 in FIG. 7, the solid-state imaging device 31' shown in FIG. 8 includes a photoelectric conversion unit 36 stacked above the light incident surface of the silicon substrate 32 and photoelectric conversion regions 33B and 33R stacked within the silicon substrate 32 having a P-type well 35 formed therein, description of which will be omitted.

The solid-state imaging device 31' is different from the solid-state imaging device 31 in FIG. 7 in that a discharge region 34' is provided instead of the discharge region 34.

The discharge region 34' is a region formed from n-type impurities at low concentration (N− region) equivalent to the photoelectric conversion regions 33B and 33R and is connected, together with the lower electrode 39 of the photoelectric conversion unit 36, to the G signal output unit (not shown). The discharge region 34' takes in the charges generated by photoelectric conversion in the region between the photoelectric conversion regions 33B and 33R and outputs these charges to the G signal output unit. The charges taken into the discharge region 34' are therefore added to the G signal output from the photoelectric conversion unit 36.

The solid-state imaging device 31' thus configured can achieve excellent color reproducibility because of the reduced overlapping between the spectral sensitivity characteristics of the different colors and can increase the output of the G signal because the charges taken into the discharge region 34' are added to the G signal. More specifically, when the photoelectric conversion unit 36 fails to photoelectrically convert all the light of green wavelength band, for example, and transmits part of the light of green wavelength band, the charges photoelectrically converted from this transmitted light are taken into the discharge region 34' and added to the G signal. Accordingly, the solid-state imaging device 31' can compensate for the decreased G signal due to the light of green wavelength band transmitted through the photoelectric conversion unit 36 with the charges output from the discharge region 34'.

When the photoelectric conversion unit 36 is used, it is supposed that the solid-state imaging device 31' is configured such that the signal charges from the photoelectric conversion unit 36 are accumulated once in a charge accumulation region (not shown) before being output. The charge accumulation region may be disposed within the silicon substrate 32. Alternatively, the signal charges may be accumulated in a capacitor formed on the silicon substrate 32. When the charges from the discharge region 34' are added to the signal charges from the photoelectric conversion unit 36, the discharge region 34' may be connected directly to the charge accumulation region for accumulating the signal charges from the photoelectric conversion unit 36. Alternatively, the charges from the discharge region 34' may be transferred via a charge transfer gate (not shown) to the charge accumulation region for accumulating the signal charges from the photoelectric conversion unit 36. Alternatively, the signal output from the photoelectric conversion unit 36 and the signal output from the discharge region 34' may be added outside the solid-state imaging device 31'.

Figure 9:
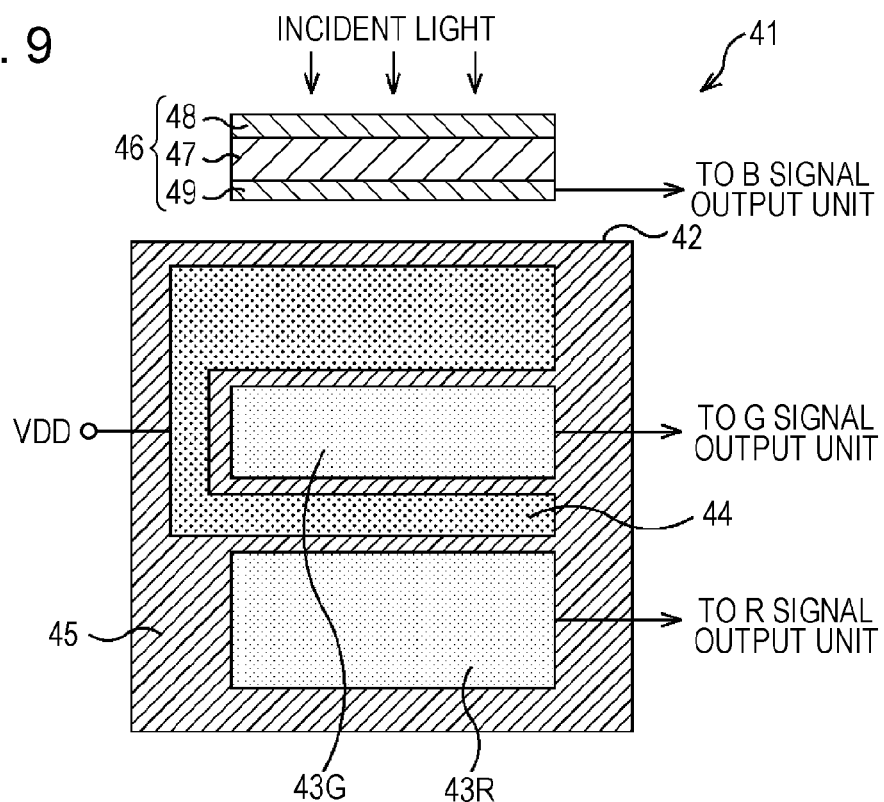
FIG. 9 is a sectional view of an exemplary configuration of the solid-state imaging device to which still another embodiment of the present technology is applied.

FIG. 9 is a sectional view of an exemplary configuration of the solid-state imaging device to which still another embodiment of the present technology is applied, showing the structure of a single pixel in the solid-state imaging device.

As shown in FIG. 9, the solid-state imaging device 41 includes the upper portion of a discharge region 44, a photoelectric conversion region 43G, the lower portion of the discharge region 44, and a photoelectric conversion region 43R stacked in this order within a silicon substrate 42 of each pixel, the upper portion of the discharge region 44 being the closest to the light incident surface. The solid-state imaging device 41 also has a P-type well 45 formed between these regions to isolate these regions. Above the light incident surface of the solid-state imaging device 41, a photoelectric conversion unit 46 is stacked with an insulating film (not shown) in between.

Similarly to the photoelectric conversion region 23G in FIG. 3, the photoelectric conversion region 43G photoelectrically converts light of green wavelength band and outputs through the G signal output unit a G signal corresponding to the intensity of the light of green wavelength band. Similarly to the photoelectric conversion region 23R in FIG. 3, the photoelectric conversion region 43R photoelectrically converts light of red wavelength band and outputs through the R signal output unit an R signal corresponding to the intensity of the light of red wavelength band.

The discharge region 44 is an N+ region connected to a power supply terminal VDD of a predetermined voltage. The discharge region 44 is formed in a substantially C-shaped cross section, including a portion extending between the light incident surface of the silicon substrate 42 and the photoelectric conversion region 43G, a portion extending between the photoelectric conversion regions 43G and 43R, and a portion connecting these two portions. The portion of the discharge region 44 extending between the light incident surface of the silicon substrate 42 and the photoelectric conversion region 43G includes a region corresponding to the photoelectric conversion region 23B in FIG. 3.

The portion of the discharge region 44 extending between the light incident surface of the silicon substrate 42 and the photoelectric conversion region 43G takes in the charges generated by photoelectric conversion in the region between the light incident surface of the silicon substrate 42 and the photoelectric conversion region 43G and discharges these charges through the power supply terminal VDD. The portion of the discharge region 44 extending between the photoelectric conversion regions 43G and 43R takes in the charges generated by photoelectric conversion in the region between the photoelectric conversion regions 43G and 43R and discharges these charges through the power supply terminal VDD.

The photoelectric conversion unit 46 includes between an upper electrode 48 and a lower electrode 49 a photoelectric conversion film 47 that has the maximum sensitivity to wavelengths around 450 nm and photoelectrically converts light of blue wavelength band. A B signal output unit (not shown) is connected to the lower electrode 49 and a voltage is applied across the upper and lower electrodes 48 and 49 such that the charges photoelectrically converted in the photoelectric conversion film 47 are output through the lower electrode 49. Accordingly, the photoelectric conversion unit 46 outputs through the B signal output unit connected to the lower electrode 49 a signal corresponding to the charges generated by photoelectric conversion in the photoelectric conversion film 47, i.e., a B signal corresponding to the intensity of the light of blue wavelength band.

In the solid-state imaging device 41 thus configured, the light of blue wavelength band out of the light incident on the solid-state imaging device 41 is photoelectrically converted in the photoelectric conversion unit 46, while the light of other wavelength bands corresponding to other colors passes through the photoelectric conversion unit 46 and enters the silicon substrate 42. In the solid-state imaging device 41, since the photoelectric conversion unit 46 absorbs and photoelectrically converts all the light of blue wavelength band, the light of blue wavelength band does not enter the silicon substrate 42. Accordingly, the solid-state imaging device 41 can prevent crosstalk from being generated in the photoelectric conversion regions 43G and 43R due to the light of blue wavelength band. In addition, in the solid-state imaging device 41, crosstalk is not generated in the photoelectric conversion unit 46 due to the light of green and red wavelength bands.

Of the light (other than blue wavelength band) incident on the silicon substrate 42, the light of green wavelength band is photoelectrically converted in the photoelectric conversion region 43G, while the light of red wavelength band is photoelectrically converted in the photoelectric conversion region 43R. In the solid-state imaging device 41, the discharge region 44 can take in and discharge the charges generated by photoelectric conversion in the region between the light incident surface of the silicon substrate 42 and the photoelectric conversion region 43G. In the solid-state imaging device 41, the discharge region 44 can also take in and discharge the charges generated by photoelectric conversion in the region between the photoelectric conversion regions 43G and 43R.

The solid-state imaging device 41 can therefore avoid the charges generated by photoelectric conversion in the region between the light incident surface of the silicon substrate 42 and the photoelectric conversion region 43G from being taken into the photoelectric conversion region 43G and output as a G signal. Accordingly, the solid-state imaging device 41 can prevent crosstalk from being generated due to the charges generated by photoelectric conversion in the region between the light incident surface of the silicon substrate 42 and the photoelectric conversion region 43G.

Similarly, the solid-state imaging device 41 can avoid the charges generated by photoelectric conversion in the region between the photoelectric conversion regions 43G and 43R from being taken into the photoelectric conversion region 43G or 43R and output as a G or R signal. Accordingly, the solid-state imaging device 41 can prevent crosstalk from being generated between the G and R signals.

Thus, the solid-state imaging device 41 can suppress the generation of crosstalk between the different colors, achieving better color separation performance and improving the color reproducibility of captured images.

Alternatively, the discharge region 44 may be divided into two discrete (unconnected) portions: one portion extending between the light incident surface of the silicon substrate 42 and the photoelectric conversion region 43G and the other portion extending between the photoelectric conversion regions 43G and 43R, for example. In this case, the discrete portions forming the discharge region 44 can be connected outside the silicon substrate 42 to different power supply terminals or to a common power supply terminal.

Figure 10:
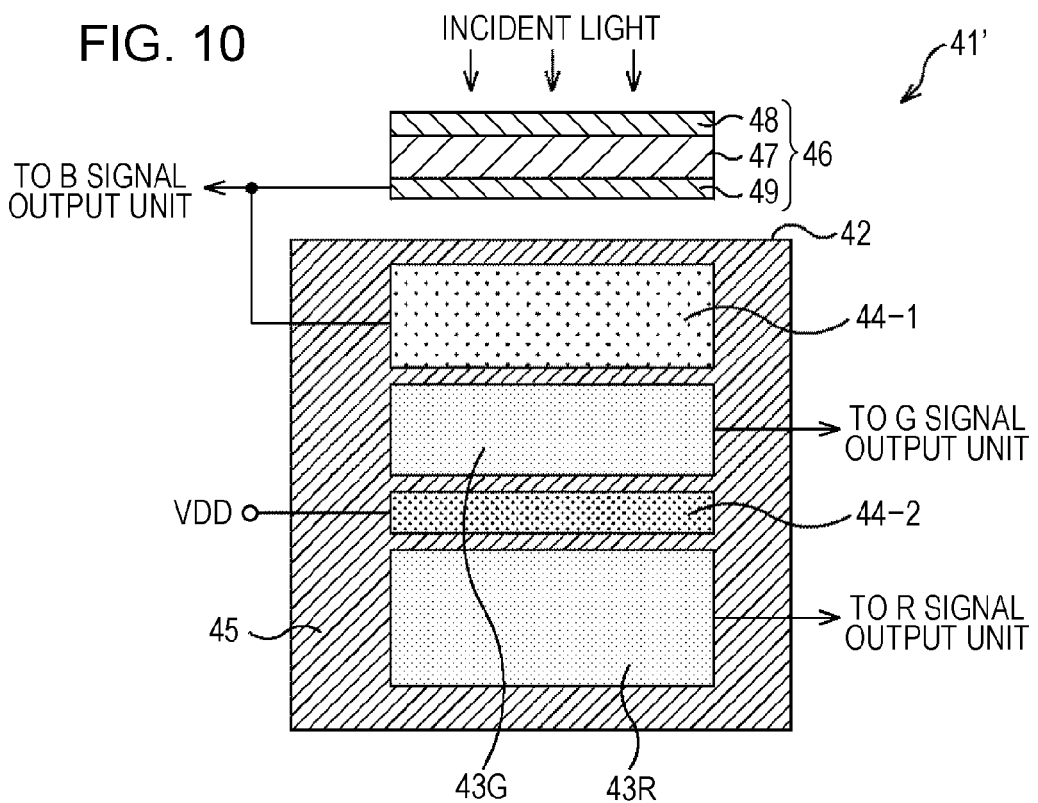
FIG. 10 is a sectional view showing an exemplary configuration of a variation of the solid-state imaging device to which the still other embodiment of the present technology is applied.

FIG. 10 is a sectional view showing an exemplary configuration of a variation of the solid-state imaging device to which the still other embodiment of the present technology is applied.

Similarly to the solid-state imaging device 41 in FIG. 9, the solid-state imaging device 41' shown in FIG. 10 includes a photoelectric conversion unit 46 stacked above the light incident surface of the silicon substrate 42 and photoelectric conversion regions 43G and 43R stacked within the silicon substrate 42 having a P-type well 45 formed therein, description of which will be omitted.

More specifically, the solid-state imaging device 41' is different from the solid-state imaging device 41 in FIG. 9 in that first and second discharge regions 44-1 and 44-2 are provided instead of the discharge region 44. The first discharge region 44-1 is formed between the light incident surface of the silicon substrate 42 and the photoelectric conversion region 43G, while the second discharge region 44-2 is formed between the photoelectric conversion regions 43G and 43R.

The first discharge region 44-1 is a region formed from n-type impurities at low concentration (N− region) equivalent to the photoelectric conversion regions 43G and 43R and is connected, together with the lower electrode 49 of the photoelectric conversion unit 46, to the B signal output unit (not shown). The first discharge region 44-1 takes in the charges generated by photoelectric conversion in the region between the light incident surface of the silicon substrate 42 and the photoelectric conversion region 43G and outputs these charges to the B signal output unit. The charges taken into the first discharge region 44-1 are therefore added to the B signal output from the photoelectric conversion unit 46.

Similarly to the discharge region 44 in FIG. 9, the second discharge region 44-2 is an N+ region connected to a power supply terminal VDD of a predetermined voltage. The second discharge region 44-2 takes in the charges generated by photoelectric conversion in the region between the photoelectric conversion regions 43G and 43R and discharges these charges through the power supply terminal VDD.

The solid-state imaging device 41' thus configured achieves reduced overlapping between the spectral sensitivity characteristics of the different colors and enhances color reproducibility. In the solid-state imaging device 41', since the charges taken into the first discharge region 44-1 are added to the B signal, the output B signal is increased on the same principle as the increase of output G signal in the solid-state imaging device 31' in FIG. 8.

Figure 11:
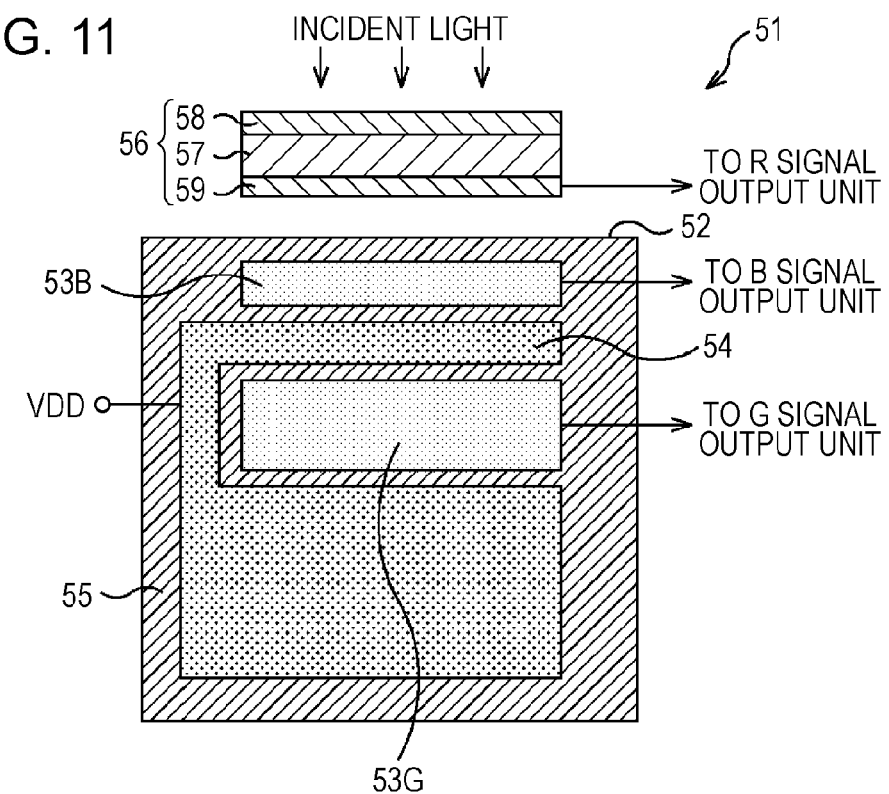
FIG. 11 is a sectional view of an exemplary configuration of the solid-state imaging device to which yet another embodiment of the present technology is applied.

FIG. 11 is a sectional view of an exemplary configuration of the solid-state imaging device to which yet another embodiment of the present technology is applied, showing the structure of a single pixel in the solid-state imaging device.

As shown in FIG. 11, the solid-state imaging device 51 includes a photoelectric conversion region 53B, the upper portion of a discharge region 54, a photoelectric conversion region 53G, and the lower portion of the discharge region 54 stacked in this order within a silicon substrate 52 of each pixel, the photoelectric conversion region 53B being the closest to the light incident surface. The solid-state imaging device 51 also has a P-type well 55 formed between these regions to isolate these regions. Above the light incident surface of the solid-state imaging device 51, a photoelectric conversion unit 56 is stacked with an insulating film (not shown) in between.

Similarly to the photoelectric conversion region 23B in FIG. 3, the photoelectric conversion region 53B photoelectrically converts light of blue wavelength band and outputs through the B signal output unit a B signal corresponding to the intensity of the light of blue wavelength band. Similarly to the photoelectric conversion region 23G in FIG. 3, the photoelectric conversion region 53G photoelectrically converts light of green wavelength band and outputs through the G signal output unit a G signal corresponding to the intensity of the light of green wavelength band.

The discharge region 54 is an N+ region connected to a power supply terminal VDD of a predetermined voltage. The discharge region 54 is formed in a substantially C-shaped cross section including a portion extending between the photoelectric conversion regions 53B and 53G, a portion formed in a region deeper than the photoelectric conversion region 53G, and a portion connecting these two portions. The portion of the discharge region 54 formed in the region deeper than the photoelectric conversion region 53G includes a region corresponding to the photoelectric conversion region 23R in FIG. 3.

The portion of the discharge region 54 extending between the photoelectric conversion regions 53B and 53G takes in the charges generated by photoelectric conversion in the region between the photoelectric conversion regions 53B and 53G and discharges these charges through the power supply terminal VDD. The portion of the discharge region 54 formed in the region deeper than the photoelectric conversion region 53G takes in the charges generated by photoelectric conversion in the region deeper than the photoelectric conversion region 53G and discharges these charges through the power supply terminal VDD.

The photoelectric conversion unit 56 includes between an upper electrode 58 and a lower electrode 59 a photoelectric conversion film 57 that has the maximum sensitivity to wavelengths around 650 nm and photoelectrically converts light of red wavelength band. An R signal output unit (not shown) is connected to the lower electrode 59 and a voltage is applied across the upper and lower electrodes 58 and 59 to output through the lower electrode 59 the charges generated by photoelectric conversion in the photoelectric conversion film 57. The photoelectric conversion unit 56 therefore outputs through the R signal output unit connected to the lower electrode 59 a signal corresponding to the charges generated by photoelectric conversion in the photoelectric conversion film 57, i.e., an R signal corresponding to the intensity of the light of red wavelength band.

In the solid-state imaging device 51 thus configured, the light of red wavelength band out of the light incident on the solid-state imaging device 51 is photoelectrically converted in the photoelectric conversion unit 56, while the light of other wavelength bands corresponding to other colors passes through the photoelectric conversion unit 56 and enters the silicon substrate 52. In the solid-state imaging device 51, since the photoelectric conversion unit 56 absorbs and photoelectrically converts all the light of red wavelength band, the light of red wavelength band does not enter the silicon substrate 52. Accordingly, the solid-state imaging device 51 can prevent crosstalk from being generated in the photoelectric conversion regions 53B and 53G due to the light of red wavelength band. In addition, in the solid-state imaging device 51, crosstalk is not generated in the photoelectric conversion unit 56 due to the light of blue and green wavelength bands.

Of the light (other than red wavelength band) incident on the silicon substrate 52, the light of blue wavelength band is photoelectrically converted in the photoelectric conversion region 53B, while the light of green wavelength band is photoelectrically converted in the photoelectric conversion region 53G. In the solid-state imaging device 51, the discharge region 54 can take in and discharge the charges generated by photoelectric conversion in the region between the photoelectric conversion regions 53B and 53G and the charges generated by photoelectric conversion in the region deeper than the photoelectric conversion region 53G.

The solid-state imaging device 51 can therefore avoid the charges generated by photoelectric conversion in the region between the photoelectric conversion regions 53B and 53G from being taken into the photoelectric conversion region 53B or 53G and output as a B or G signal. Accordingly, the solid-state imaging device 51 can avoid crosstalk from being generated between the B and G signals due to the charges generated by photoelectric conversion in the region between the photoelectric conversion regions 53B and 53G.

Similarly, the solid-state imaging device 51 can avoid the charges generated by photoelectric conversion in the region deeper than the photoelectric conversion region 53G from being taken into the photoelectric conversion region 53G and output as a G signal. Accordingly, the solid-state imaging device 51 can prevent crosstalk from being generated due to the charges generated by photoelectric conversion in the region deeper than the photoelectric conversion region 53G.

Thus, the solid-state imaging device 51 can suppress the generation of crosstalk between the different colors, achieving better color separation performance and enhancing the color reproducibility of captured images.

Alternatively, the discharge region 54 may be configured such that, for example, the portion extending between the photoelectric conversion regions 53B and 53G and the portion formed in the region deeper than the photoelectric conversion region 53G are formed as discrete (not connected) portions. In this case, the portions forming the discharge region 54 can be connected outside the silicon substrate 52 to different power supply terminals or to a common power supply terminal.

Figure 12:
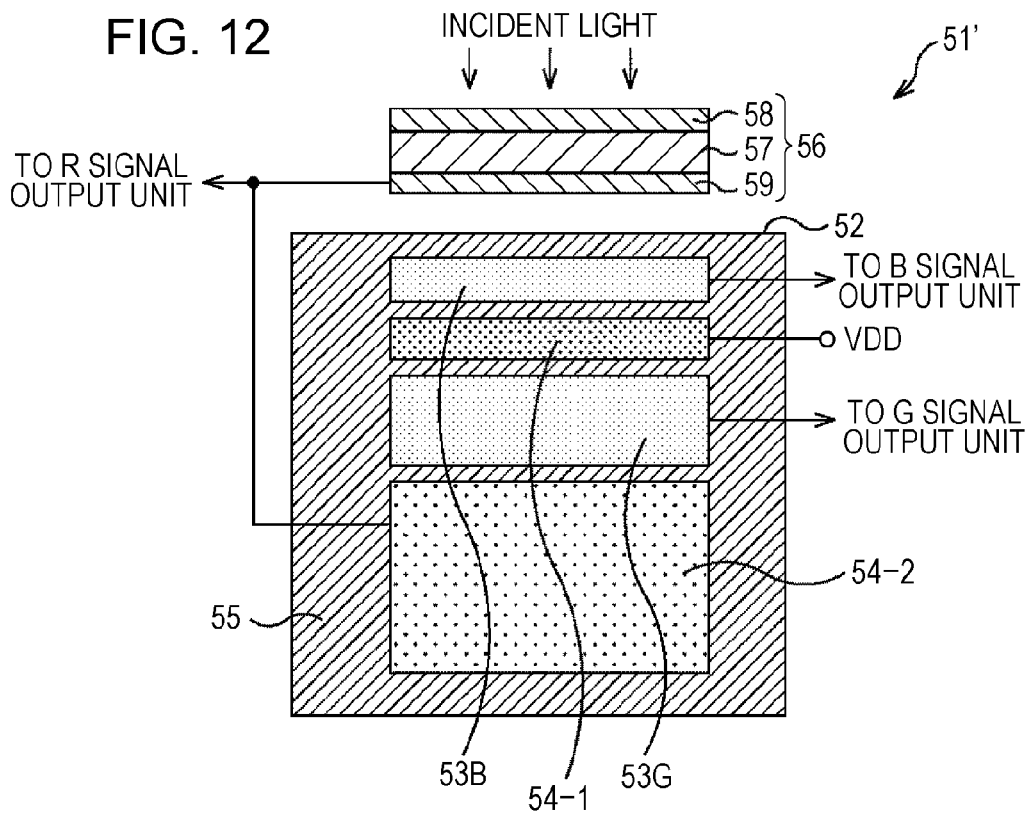
FIG. 12 is a sectional view showing an exemplary configuration of a variation of the solid-state imaging device to which the yet other embodiment of the present technology is applied.

FIG. 12 is a sectional view showing an exemplary configuration of a variation of the solid-state imaging device to which the yet other embodiment of the present technology is applied.

Similarly to the solid-state imaging device 51 in FIG. 11, the solid-state imaging device 51' shown in FIG. 12 includes a photoelectric conversion unit 56 stacked above the light incident surface of the silicon substrate 52 and photoelectric conversion regions 53B and 53G stacked within the silicon substrate 52 having a P-type well 55 formed therein, description of which will be omitted.

More specifically, the solid-state imaging device 51' is different from the solid-state imaging device 51 in FIG. 11 in that first and second discharge regions 54-1 and 54-2 are provided instead of the discharge region 54. The first discharge region 54-1 is formed between the photoelectric conversion regions 53B and 53G and the second discharge region 54-2 is formed in a region deeper than the photoelectric conversion region 53G.

Similarly to the discharge region 54 in FIG. 11, the first discharge region 54-1 is an N+ region connected to a power supply terminal VDD of a predetermined voltage. The first discharge region 54-1 takes in the charges generated by photoelectric conversion in the region between the photoelectric conversion regions 53B and 53G and discharges these charges through the power supply terminal VDD.

The second discharge region 54-2 is a region formed from n-type impurities at low concentration (N− region) equivalent to the photoelectric conversion regions 53B and 53G and is connected, together with the lower electrode 59 of the photoelectric conversion unit 56, to an R signal output unit (not shown). The second discharge region 54-2 takes in the charges generated by photoelectric conversion in the region deeper than the photoelectric conversion region 53G and outputs these charges to the R signal output unit. The charges taken into the second discharge region 54-2 are therefore added to the R signal output from the photoelectric conversion unit 56.

The solid-state imaging device 51' thus configured reduces the overlapping between the spectral sensitivity characteristics of the different colors and improves color reproducibility. In the solid-state imaging device 51', since the charges taken into the second discharge region 54-2 are added to the R signal, the output R signal is increased on the same principle as the increase of output G signal in the solid-state imaging device 31' in FIG. 8.

Figure 13:
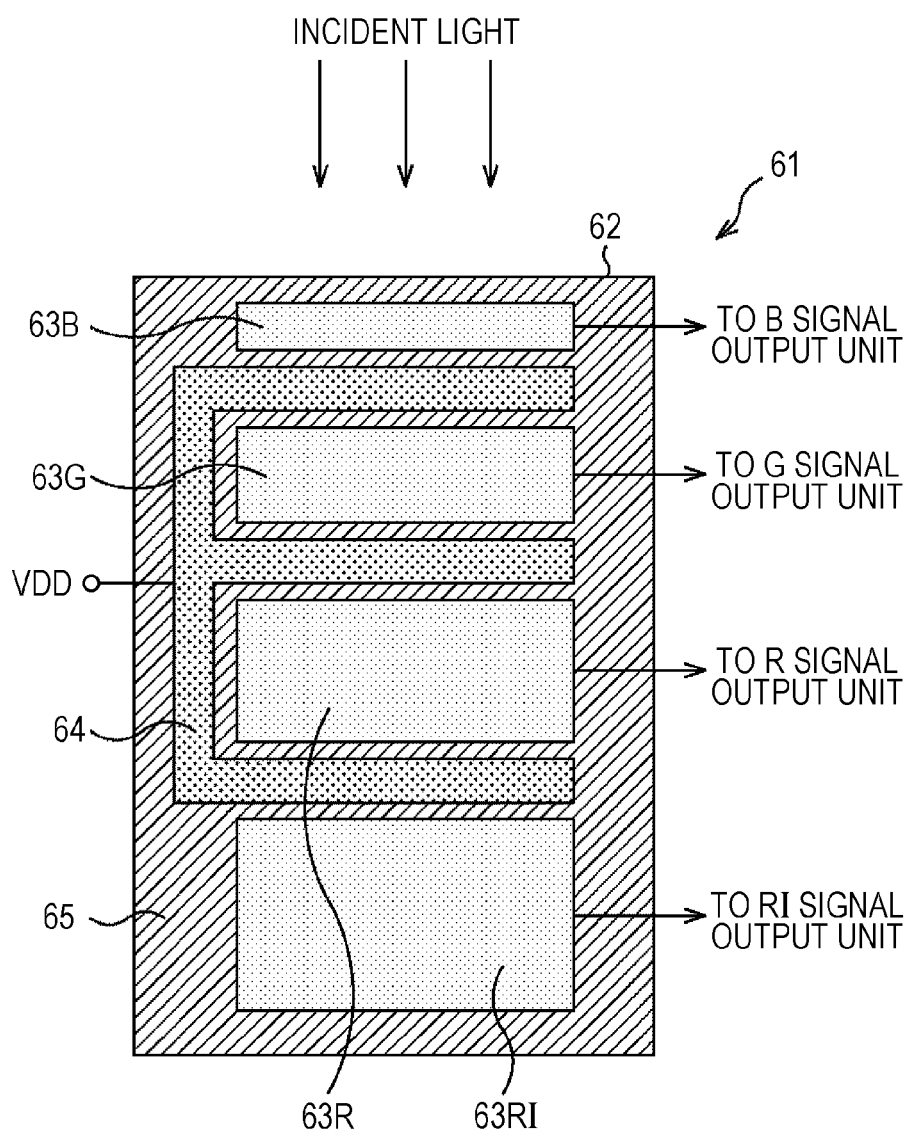
FIG. 13 is a sectional view of an exemplary configuration of the solid-state imaging device to which yet another embodiment of the present technology is applied.

FIG. 13 is a sectional view of an exemplary configuration of the solid-state imaging device to which yet another embodiment of the present technology is applied, showing the structure of a single pixel in the solid-state imaging device.

As shown in FIG. 13, the solid-state imaging device 61 includes a photoelectric conversion region 63B, the upper portion of a discharge region 64, a photoelectric conversion region 63G, the intermediate portion of the discharge region 64, a photoelectric conversion region 63R, the lower portion of the discharge region 64, and a photoelectric conversion region 63RI stacked in this order within the silicon substrate 62 of each pixel, the photoelectric conversion region 63B being the closest to the light incident surface. The solid-state imaging device 61 also has a P-type well 65 formed between these regions to isolate these regions.

Similarly to the photoelectric conversion regions 23B, 23G, and 23R in FIG. 3, the photoelectric conversion regions 63B, 63G, and 63R output B, G, and R signals, respectively.

The photoelectric conversion region 63RI is an n-type impurity region formed within the silicon substrate 62 at the depth having the maximum sensitivity to the light of infrared wavelength band of 700 nm or higher and photoelectrically converts the light of infrared wavelength band out of the light incident on the solid-state imaging device 61. The photoelectric conversion region 63RI also has an RI signal output unit (not shown) connected thereto and outputs through the RI signal output unit a signal corresponding to the charges generated by photoelectric conversion, i.e., a signal corresponding to the intensity of the light of infrared wavelength band (referred to hereinafter as RI signal as appropriate).

The discharge region 64 is an N+ region connected to a power supply terminal VDD of a predetermined voltage. The discharge region 64 is formed in a substantially E-shaped cross section including a portion extending between the photoelectric conversion regions 63B and 63G, a portion extending between the photoelectric conversion regions 63G and 63R, a portion extending between the photoelectric conversion regions 63R and 63RI, and a portion connecting these three portions.

The portion of the discharge region 64 extending between the photoelectric conversion regions 63B and 63G takes in the charges generated by photoelectric conversion in the region between the photoelectric conversion regions 63B and 63G and discharges these charges through the power supply terminal VDD. The portion of the discharge region 64 extending between the photoelectric conversion regions 63G and 63R takes in the charges generated by photoelectric conversion in the region between the photoelectric conversion regions 63G and 63R and discharges these charges through the power supply terminal VDD. The portion of the discharge region 64 extending between the photoelectric conversion regions 63R and 63RI takes in the charges generated by photoelectric conversion in the region between the photoelectric conversion regions 63R and 63RI and discharges these charges through the power supply terminal VDD.

As described above, the solid-state imaging device 61 includes in each pixel a stack of the photoelectric conversion region 63B sensitive to the light of blue wavelength band, the photoelectric conversion region 63G sensitive to the light of green wavelength band, the photoelectric conversion region 63R sensitive to the light of red wavelength band, and the photoelectric conversion region 63RI sensitive to the light of infrared wavelength band.

In the solid-state imaging device 61, the charges generated by photoelectric conversion in the region between the photoelectric conversion regions 63B and 63G can be taken into and discharged through the discharge region 64. The solid-state imaging device 61 can therefore avoid the charges generated by photoelectric conversion in the region between the photoelectric conversion regions 63B and 63G from being taken into the photoelectric conversion region 63B or 63G and output as a B or G signal.

Similarly, the solid-state imaging device 61 can avoid the charges generated by photoelectric conversion in the region between the photoelectric conversion regions 63G and 63R from being taken into the photoelectric conversion region 63G or 63R and output as a G or R signal. In addition, the solid-state imaging device 61 can avoid the charges generated by photoelectric conversion in the region between the photoelectric conversion regions 63R and 63RI from being taken into the photoelectric conversion region 63R or 63RI and output as a G or RI signal.

The solid-state imaging device 61 can therefore prevent the generation of crosstalk between the B and G signals, between the G and R signals, and between the R and RI signals. More specifically, the solid-state imaging device 61 can discharge through the discharge region 64 the charges generated by photoelectric conversion in the regions between the photoelectric conversion regions 63B, 63G, 63R, and 63RI adjacent to each other in the depth direction of the silicon substrate 62 and thus prevent crosstalk from being generated by the charges photoelectrically converted in the regions between the adjacent photoelectric conversion regions 63B, 63G, 63R, and 63RI. With this, the solid-state imaging device 61 can achieve spectral shapes with reduced overlapping between the spectrum distributions of the different colors and improve color reproducibility.

As a variation of the solid-state imaging device 61, a configuration may be adopted in which the discharge region 64 is formed including, for example, the region in which the photoelectric conversion region 63G is formed and a photoelectric conversion unit 36 is stacked as shown in FIG. 7. Similarly, as another variation of the solid-state imaging device 61, another configuration may be adopted in which the discharge region 64 is formed including the region in which the photoelectric conversion region 63B or 63R is formed and the photoelectric conversion unit 46 (FIG. 9) or 56 (FIG. 11) is stacked. As a further variation of the solid-state imaging device 61, a configuration may be adopted in which the discharge region 64 is formed including, for example, the region in which the photoelectric conversion region 63RI is formed and a photoelectric conversion unit for photoelectrically converting the light of infrared wavelength band is stacked.

In short, a configuration can be adopted in which a photoelectric conversion unit corresponding to one of the photoelectric conversion regions 63B, 63G, 63R, and 63RI is stacked above the light incident surface of the solid-state imaging device 61. Alternatively, a configuration may be adopted in which a photoelectric conversion unit corresponding to two of the photoelectric conversion regions 63B, 63G, 63R, and 63RI is stacked above the light incident surface of the solid-state imaging device 61.

If the photoelectric conversion unit is used instead of a photoelectric conversion region 63 formed within the silicon substrate 62, which is limited in volume, the sensitivity can be enhanced and the amount of signal charges can be increased by replacing the photoelectric conversion region 63 expected to output a color signal at the highest level with the photoelectric conversion unit. For example, it is supposed that the photoelectric conversion region 63G sensitive to the green light to which the human eye has the highest sensitivity is replaced with the photoelectric conversion unit.

To secure a large area for the discharge region 64 to form the discharge region 64 easily, it is desirable to replace the photoelectric conversion region 63 interposed between other photoelectric conversion regions 63 with the photoelectric conversion unit. If a single photoelectric conversion region 63 is replaced with a photoelectric conversion unit, it is desirable to replace the photoelectric conversion region 63G or 63R with a photoelectric conversion unit. If two photoelectric conversion regions 63 are replaced with a photoelectric conversion unit, it is desirable to replace a combination of photoelectric conversion regions 63G and 63R or a combination of photoelectric conversion regions 63B and 63R with a photoelectric conversion unit.

If the photoelectric conversion region 63RI formed at the deepest position is replaced with a photoelectric conversion unit, the silicon substrate 62 can be reduced in thickness and thereby the solid-state imaging device 61 can be reduced in size.

The discharge region 64 may be formed such that the portions formed between the photoelectric conversion regions 63B, 63G, 63R, and 63RI, for example, are discrete (not connected). In this case, the portions forming the discharge region 64 can be connected outside the silicon substrate 62 to different power supply terminals or to a common power supply terminal. This configuration is also applicable to the variations of the solid-state imaging device 61 described above.

Figure 14A:
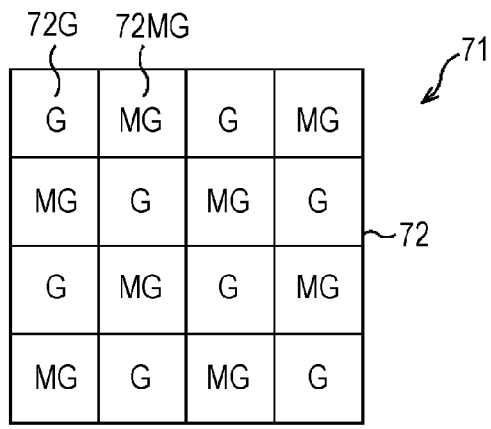
FIGS. 14A to 14C are sectional views of an exemplary configuration of the solid-state imaging device to which yet another embodiment of the present technology is applied.
Figure 14B:
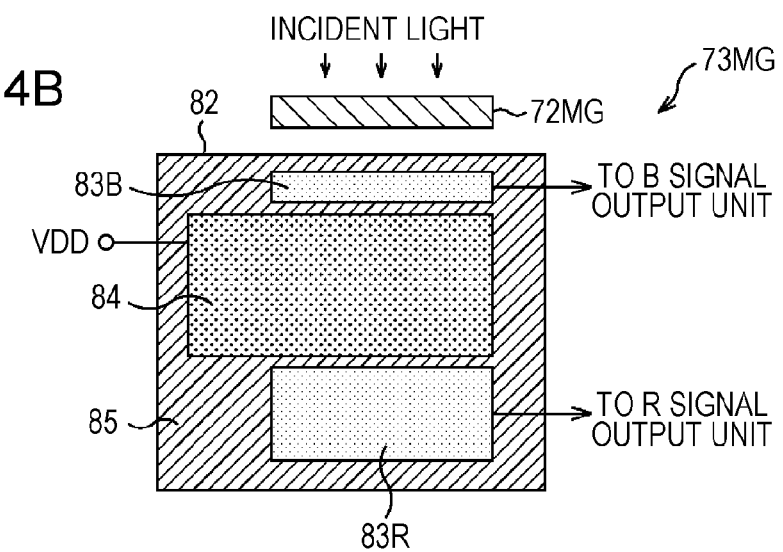
Figure 14C:
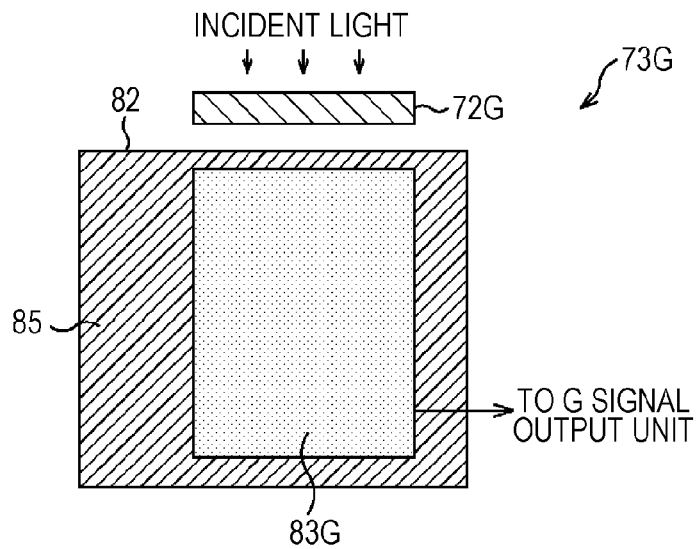

FIGS. 14A to 14C are sectional views of an exemplary configuration of the solid-state imaging device to which yet another embodiment of the present technology is applied.

FIG. 14A shows the color arrangement of the color filter 72 formed on the solid-state imaging device 71. The color filter 72 has magenta filters 72MG transparent to the light of blue and red wavelength bands and green filters 72G transparent to the light of green wavelength band, arranged in a checkered pattern. Accordingly, the solid-state imaging device 71 includes magenta pixels for outputting signals corresponding to the charges photoelectrically converted from the light of blue and red wavelength bands and green pixels for outputting signals corresponding to the charges photoelectrically converted from the light of green wavelength band.

FIG. 14B is a sectional view showing an exemplary configuration of a magenta pixel in the solid-state imaging device 71; FIG. 14C is a sectional view showing an exemplary configuration of a green pixel in the solid-state imaging device 71.

As shown in FIG. 14B, the magenta pixel 73MG in the solid-state imaging device 71 includes a photoelectric conversion region 83B, a discharge region 84, and a photoelectric conversion region 83R stacked in this order within the silicon substrate 82, the photoelectric conversion region 83B being the closest to the light incident surface. The solid-state imaging device 71 also has a P-type well 85 formed between these regions to isolate these regions.

Similarly to the photoelectric conversion region 23B in FIG. 3, the photoelectric conversion region 83B photoelectrically converts light of blue wavelength band and outputs through a B signal output unit a B signal corresponding to the intensity of the light of blue wavelength band. Similarly to the photoelectric conversion region 23R in FIG. 3, the photoelectric conversion region 83R photoelectrically converts light of red wavelength band and outputs through an R signal output unit an R signal corresponding to the intensity of the light of red wavelength band. The discharge region 84 is an N+ region connected to a power supply terminal VDD of a predetermined voltage and formed including a region corresponding to the photoelectric conversion region 23B in FIG. 3.

As shown in FIG. 14C, the green pixel 73G in the solid-state imaging device 71 has the photoelectric conversion region 83G formed within the silicon substrate 82, including a region corresponding to the photoelectric conversion regions 23B, 23G, and 23R in FIG. 3. In the solid-state imaging device 71, a P-type well 85 is formed to isolate the photoelectric conversion region 83G from the other regions.

In the magenta pixel 73MG, light of blue and red wavelength bands passes through the magenta filter 72MG and enters the silicon substrate 82, in which the light of blue wavelength band is photoelectrically converted in the photoelectric conversion region 83B, while the light of red wavelength band is photoelectrically converted in the photoelectric conversion region 83R. In the magenta pixel 73MG, the charges generated by photoelectric conversion in the region between the photoelectric conversion regions 83B and 83R can be taken into and discharged through the discharge region 84.

In the green pixel 73G, light of green wavelength band passes through the green filter 72G and enters the silicon substrate 82, in which the light of green wavelength band is photoelectrically converted in the photoelectric conversion region 83G. All the light having passed through the green filter 72G is photoelectrically converted in the photoelectric conversion region 83G.

In the solid-state imaging device 71 thus configured, the signals of red and blue wavelength bands are output from the magenta pixel 73MG and, in the magenta pixel 73MG, the charges generated by photoelectric conversion in the region between the photoelectric conversion regions 83B and 83R are discharged through the discharge region 84. Since only the charges corresponding to the light of red and blue wavelength bands are taken into the photoelectric conversion regions 83B and 83R, spectral shapes with reduced overlapping between the spectrum distributions of the B and R signals can be achieved.

In the green pixel 73G in the solid-state imaging device 71, only light of green wavelength band passes through the green filter 72G and is taken into the silicon substrate 82, in which the light of green wavelength band is photoelectrically converted in the photoelectric conversion region 83G. The green filter 72G may be replaced with a photoelectric conversion unit (photoelectric conversion unit 36 in FIG. 7) that photoelectrically converts only the light of green wavelength band, for example. Alternatively, a photoelectric conversion region 83G may be formed within the silicon substrate 82 at the depth at which light of green wavelength band alone is photoelectrically converted and the charges alone corresponding to the light of green wavelength band may be output from the photoelectric conversion region 83G.

When highly intensive light enters the solid-state imaging device 21 (or solid-state imaging device of any one of the embodiments described above), for example, charges may be photoelectrically converted in the photoelectric conversion regions 23 exceeding the accumulation capacity thereof. In such a case, the discharge region 24 formed between the photoelectric conversion regions 23 can serve as an overflow drain to discharge excessive charges exceeding the accumulation capacities of the photoelectric conversion regions 23.

In this embodiment, a constant or pulsed potential may be applied to the discharge region 24 through the power supply terminal VDD. When a pulsed voltage is applied, a predetermined voltage should be applied at least in a charge accumulation period. The charge accumulation period can also be controlled by eliminating the potential barrier present between the photoelectric conversion region 23 and the discharge region 24 during a period other than the charge accumulation period and thus depleting the photoelectric conversion region 23, for example.

A solid-state imaging device as described above is applicable to various types of electronic apparatus including, for example, digital still cameras, digital video cameras, or other imaging systems, and mobile telephones or other apparatus equipped with imaging functions.

Figure 15:
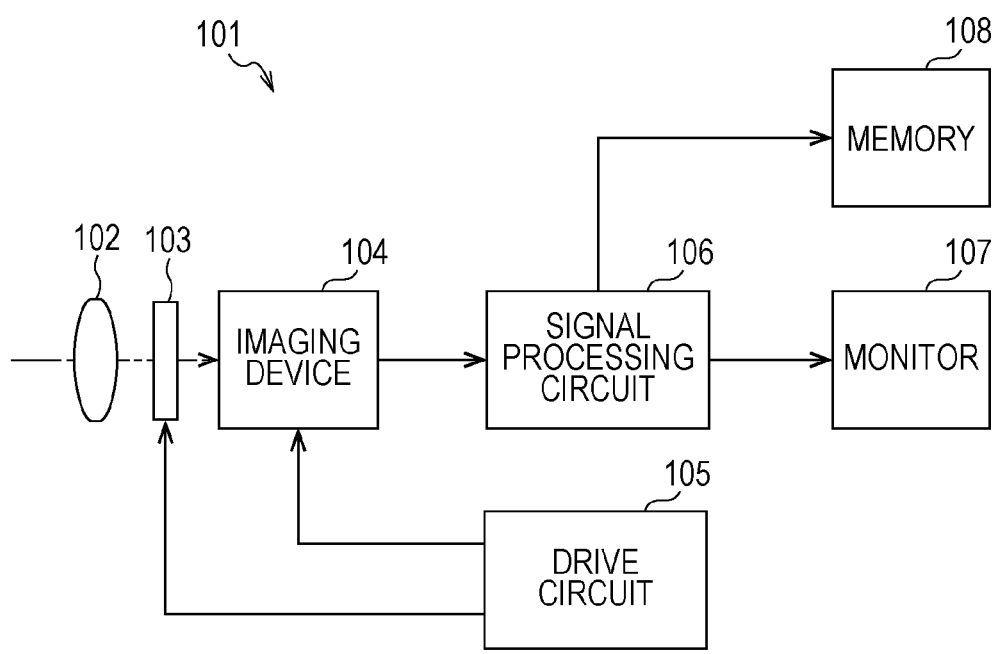
FIG. 15 is a block diagram showing an exemplary configuration of an imaging unit installed in an electronic apparatus.

FIG. 15 is a block diagram showing an exemplary configuration of an imaging unit to be installed in an electronic apparatus.

As shown in FIG. 15, the imaging unit 101 includes an optical system 102, a shutter device 103, imaging device 104, drive circuit 105, signal processing circuit 106, monitor 107, and memory 108 and can capture both still and moving images.

The optical system 102 includes one or more lenses and directs the image light (incident light) from a subject to the imaging device 104 to form an image on the light-receiving surface (sensor unit) of the imaging device 104.

The shutter device 103 is disposed between the optical system 102 and the imaging device 104 and controls the light-irradiated period and light-shielded period of the imaging device 104 under the control of the drive circuit 105.

As the imaging device 104, any one of the embodiments and variations of the solid-state imaging device as described above is applicable. Signal charges are accumulated in the imaging device 104 for a certain period in accordance with the image formed on the light-receiving surface via the optical system 102 and shutter device 103. The signal charges accumulated in the imaging device 104 are transferred in response to a drive signal (timing signal) supplied from the drive circuit 105.

The drive circuit 105 drives the imaging device 104 and shutter device 103 by outputting drive signals for controlling the transfer operation of the imaging device 104 and the shutter operation of the shutter device 103.

The signal processing circuit 106 applies various types of signal processing to the signal charges output from the imaging device 104. The image (image data) obtained through the signal processing applied by the signal processing circuit 106 is supplied to and displayed on the monitor 107 or supplied to and stored (recorded) in the memory 108.

In the imaging unit 101 thus configured, the color reproducibility of captured images can be improved when a solid-state imaging device having good color reproducibility as described above is employed as the imaging device 104.

The configuration of the solid-state imaging device according to an embodiment of the present technology can be adopted in back-illuminated type CMOS (complementary metal oxide semiconductor) solid-state imaging devices, front-illuminated type CMOS solid-state imaging devices, and CCD (charge coupled device) solid-state imaging devices.

The embodiment of the present technology may also adopt any one of the following configurations:

(1) A solid-state imaging device including:
a plurality of photoelectric conversion regions stacked at different depths within the semiconductor substrate of each pixel to photoelectrically convert light of different wavelength bands; and
a discharge region formed between the photoelectric conversion regions adjacent to each other in the depth direction of the semiconductor substrate to discharge charges generated by photoelectric conversion in the region between the adjacent photoelectric conversion regions.

(2) The solid-state imaging device according to item (1),
wherein the discharge region is also formed between the light incident surface of the semiconductor substrate and the photoelectric conversion region formed at the position closest to the light incident surface to discharge charges generated by photoelectric conversion in that region.

(3) The solid-state imaging device according to item (1) or (2),
wherein the discharge region is also formed at a position deeper than the photoelectric conversion region formed at the position deepest away from the light incident surface of the semiconductor substrate to discharge charges generated by photoelectric conversion in that region.

(4) The solid-state imaging device according to any one of items (1) to (3),
wherein the photoelectric conversion regions are formed from semiconductor layers of first conductivity type;
wherein semiconductor layers of second conductivity type are formed between the photoelectric conversion regions to isolate the photoelectric conversion regions;
wherein the discharge region is formed from a semiconductor layer of first conductivity type interposed between the semiconductor layers of second conductivity type and is connected to a predetermined supply voltage.

(5) The solid-state imaging device according to any one of items (1) to (4),
wherein the photoelectric conversion regions photoelectrically converting light of first and second wavelength bands are stacked in two layers within the semiconductor substrate;
wherein a photoelectric conversion unit is stacked above the light incident surface of the semiconductor substrate to photoelectrically convert light of third wavelength band.

(6) The solid-state imaging device according to item (5),
wherein, of the photoelectric conversion regions stacked in two layers within the semiconductor substrate, the photoelectric conversion region formed in the layer closer to the light incident surface of the semiconductor substrate photoelectrically converts light of blue wavelength band while the photoelectric conversion region formed in the deeper layer photoelectrically converts light of red wavelength band, and the photoelectric conversion unit formed above the light incident surface of the semiconductor substrate photoelectrically converts light of green wavelength band.

(7) The solid-state imaging device according to item (6),
wherein the discharge region formed between the photoelectric conversion regions stacked in two layers within the semiconductor substrate is connected to an output unit outputting a signal from the photoelectric conversion unit.

(8) The solid-state imaging device according to item (5), wherein, of the photoelectric conversion regions stacked in two layers within the semiconductor substrate, the photoelectric conversion region formed in the layer closer to the light incident surface of the semiconductor substrate photoelectrically converts light of green wavelength band while the photoelectric conversion region formed in the deeper layer photoelectrically converts light of red wavelength band, and the photoelectric conversion unit formed above the light incident surface of the semiconductor substrate photoelectrically converts light of blue wavelength band.

(9) The solid-state imaging device according to item (8), wherein the discharge region formed between the substrate surface of the semiconductor substrate and the photoelectric conversion region formed in the layer closer to the light incident surface of the semiconductor substrate is connected to an output unit outputting a signal from the photoelectric conversion unit.

(10) The solid-state imaging device according to item (5), wherein, of the photoelectric conversion regions stacked in two layers within the semiconductor substrate, the photoelectric conversion region formed in the layer closer to the light incident surface of the semiconductor substrate photoelectrically converts light of blue wavelength band while the photoelectric conversion region formed in the deeper layer photoelectrically converts light of green wavelength band, and the photoelectric conversion unit formed above the light incident surface of the semiconductor substrate photoelectrically converts light of red wavelength band.

(11) The solid-state imaging device according to item (10), wherein the discharge region formed in a layer deeper than the photoelectric conversion region formed in the deepest layer away from the light incident surface of the semiconductor substrate is connected to an output unit outputting a signal coming from the photoelectric conversion unit.

(12) The solid-state imaging device according to any one of items (1) to (11), wherein the photoelectric conversion region formed in the deepest layer away from the light incident surface of the semiconductor substrate photoelectrically converts light of infrared wavelength band.

(13) The solid-state imaging device according to any one of items (1) to (12), further including
at least one complimentary color filter formed above the light incident surface of the semiconductor substrate.

(14) The solid-state imaging device according to item (13), wherein the complimentary color filter is a magenta filter.

The present disclosure is not limited to the embodiments described above and various modifications and changes may be made without departing from the scope and spirit of the present disclosure.

The present disclosure contains subject matter related to that disclosed in Japanese Priority Patent Application JP 2011-149972 filed in the Japan Patent Office on Jul. 6, 2011, the entire contents of which are hereby incorporated by reference.

What is claimed is:

1. A solid-state imaging device comprising: a plurality of photoelectric conversion regions stacked at different depths within a semiconductor substrate, wherein each of the photoelectric conversion regions photoelectrically converts light of a different wavelength band; and a discharge region formed between adjacent photoelectric conversion regions from the plurality of photoelectric conversion regions, the adjacent photoelectric conversion regions being adjacent to each other in a depth direction of the semiconductor substrate, and at least a portion of the discharge region being positioned outside of the photoelectric conversion regions, wherein the discharge region discharges charges generated in the discharge region to a power supply terminal.

2. The solid-state imaging device according to claim 1, further comprising a secondary discharge region that is formed between the light incident surface of the semiconductor substrate and the photoelectric conversion region formed at the position closest to the light incident surface of the semiconductor substrate to discharge charges generated by photoelectric conversion in the secondary discharge region, the secondary discharge region positioned outside of the photoelectric conversion region formed at the position closest to the light incident surface of the semiconductor substrate.

3. The solid-state imaging device according to claim 1, further comprising a secondary discharge region that is formed at a position deeper than the photoelectric conversion region formed at the position deepest away from the light incident surface of the semiconductor substrate to discharge charges generated by photoelectric conversion in the secondary discharge region, the secondary discharge region positioned outside of the photoelectric conversion region formed at the position deepest away from the light incident surface of the semiconductor substrate.

4. The solid-state imaging device according to claim 1, wherein the photoelectric conversion regions are formed from semiconductor layers of first conductivity type; wherein a semiconductor layer of second conductivity type is formed between the plurality of photoelectric conversion regions to isolate the plurality of photoelectric conversion regions; wherein the discharge region is formed from a semiconductor layer of first conductivity type interposed between the semiconductor layers of second conductivity type and is connected to a predetermined supply voltage.

5. The solid-state imaging device according to claim 1, wherein the photoelectric conversion regions photoelectrically converting light of first and second wavelength bands are stacked in two layers within the semiconductor substrate; wherein a photoelectric conversion unit photoelectrically converting light of third wavelength band is formed above the light incident surface of the semiconductor substrate.

6. The solid-state imaging device according to claim 5, wherein, of the photoelectric conversion regions stacked in two layers within the semiconductor substrate, the photoelectric conversion region formed in a layer closer to the light incident surface of the semiconductor substrate photoelectrically converts light of blue wavelength band while the photoelectric conversion region formed in a deeper layer photoelectrically converts light of red wavelength band, and the photoelectric conversion unit formed above the light incident surface of the semiconductor substrate photoelectrically converts light of green wavelength band.

7. The solid-state imaging device according to claim 6, wherein the discharge region formed between the photoelectric conversion regions stacked in two layers within the semiconductor substrate is connected to an output unit outputting a signal from the photoelectric conversion unit.

8. The solid-state imaging device according to claim 5, wherein, of the photoelectric conversion regions stacked in two layers within the semiconductor substrate, the photoelectric conversion region formed in a layer closer to the light incident surface of the semiconductor substrate photoelectrically converts light of green wavelength band while the photoelectric conversion region formed in a deeper layer photoelectrically converts light of red wavelength band, and the photoelectric conversion unit formed above the light incident surface of the semiconductor substrate photoelectrically converts light of blue wavelength band.

9. The solid-state imaging device according to claim 8, wherein the discharge region formed between the substrate surface of the semiconductor substrate and the photoelectric conversion region formed in the layer closer to the light incident surface of the semiconductor substrate is connected to an output unit outputting a signal from the photoelectric conversion unit.

10. The solid-state imaging device according to claim 5, wherein, of the photoelectric conversion regions stacked in two layers within the semiconductor substrate, the photoelectric conversion region formed in a layer closer to the light incident surface of the semiconductor substrate photoelectrically converts light of blue wavelength band while the photoelectric conversion region formed in a deeper layer photoelectrically converts light of green wavelength band, and the photoelectric conversion unit formed above the light incident surface of the semiconductor substrate photoelectrically converts light of red wavelength band.

11. The solid-state imaging device according to claim 10, wherein the discharge region formed at a position deeper than the photoelectric conversion region formed in the layer deepest away from the light incident surface of the semiconductor substrate is connected to an output unit outputting a signal from the photoelectric conversion unit.

12. The solid-state imaging device according to claim 1, wherein the photoelectric conversion region formed in the layer deepest away from the light incident surface of the semiconductor substrate photoelectrically converts light of infrared wavelength band.

13. The solid-state imaging device according to claim 1, further comprising: at least one complimentary color filter formed above the light incident surface of the semiconductor substrate.

14. The solid-state imaging device according to claim 13, wherein the complimentary color filter is a magenta filter.

15. An electronic apparatus comprising a solid-state imaging device, the solid-state imaging device including: a plurality of photoelectric conversion regions stacked at different depths within a semiconductor substrate, wherein each of the photoelectric conversion regions photoelectrically converts light of a different wavelength band; and a discharge region formed between adjacent photoelectric conversion regions from the plurality of photoelectric conversion regions, the adjacent photoelectric conversion regions being adjacent to each other in a depth direction of the semiconductor substrate, and at least a portion of the discharge region being positioned outside of the photoelectric conversion regions, wherein the discharge region discharges charges generated in the discharge region to a power supply terminal.

16. The solid-state imaging device according to claim 1, wherein the charges generated in the discharge region include a first charge and a second charge, the first charge being generated by a photoelectric conversion region that photoelectrically converts light of a green wavelength band, and the second charge being generated by a photoelectric conversion region that photoelectrically converts light of a red wavelength band, and wherein the first charge and the second charge are generated outside of the photoelectric conversion regions.

17. The solid-state imaging device according to claim 16, wherein the photoelectric conversion region that photoelectrically converts light of a green wavelength band has four sides and the discharge region is adjacent to three of the four sides, and wherein one of the three sides is adjacent to the photoelectric conversion region that photoelectrically converts light of a red wavelength band.

18. The solid-state imaging device according to claim 1, wherein the discharge region is a single continuous region within the semiconductor substrate of the pixel, and the photoelectric conversion regions are within the semiconductor substrate of the pixel.

19. The solid-state imaging device according to claim 1, wherein the discharge region discharges a third charge in the regions between the adjacent photoelectric conversion regions to reduce crosstalk between the adjacent photoelectric conversion regions, wherein the third charge is generated by photoelectric conversion in a photoelectric conversion region that is different from the photoelectric conversion generating the first charge and the photoelectric conversion generating the second charge, and wherein the third charge is generated outside of the photoelectric conversion regions.

20. The solid-state imaging device according to claim 19, wherein the discharge region is a single continuous region within the semiconductor substrate of the pixel, the photoelectric conversion regions are within the semiconductor substrate of the pixel, and the first, the second, and the third charges are generated within semiconductor substrate of the pixel and the first, the second, and the third charges are generated outside of the photoelectric conversion regions.

* * * * *